US010522197B2

(12) United States Patent
Choi et al.

(10) Patent No.: US 10,522,197 B2
(45) Date of Patent: Dec. 31, 2019

(54) MEMORY DEVICE, MEMORY SYSTEM, AND METHOD OF CONTROLLING MEMORY DEVICE

(71) Applicants: Kyung-eun Choi, Hwaseong-si (KR); Kui-yon Mun, Hwaseong-si (KR)

(72) Inventors: Kyung-eun Choi, Hwaseong-si (KR); Kui-yon Mun, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 210 days.

(21) Appl. No.: 14/796,497

(22) Filed: Jul. 10, 2015

(65) Prior Publication Data

US 2016/0092130 A1 Mar. 31, 2016

(30) Foreign Application Priority Data

Sep. 30, 2014 (KR) .......................... 10-2014-0132018

(51) Int. Cl.
*G06F 12/00* (2006.01)
*G11C 7/04* (2006.01)
(Continued)

(52) U.S. Cl.
CPC .............. *G11C 7/04* (2013.01); *G11C 7/1063* (2013.01); *G11C 11/5628* (2013.01);
(Continued)

(58) Field of Classification Search
CPC ..... G11C 7/04; G11C 7/1063; G11C 11/5628; G11C 11/5635; G11C 11/5642; G11C 16/10; G11C 16/14; G11C 16/26; G11C 16/32; G11C 16/3418; G11C 16/3456; G11C 16/0483
See application file for complete search history.

(56) References Cited

U.S. PATENT DOCUMENTS 6,754,664 B1 * 6/2004 Bush ....................... H04L 29/06
7,013,336 B1 * 3/2006 King ................... G06F 11/3034
709/224
(Continued)

FOREIGN PATENT DOCUMENTS

JP 20090026119 A 2/2009
KR 20080097822 A 11/2008
(Continued)

OTHER PUBLICATIONS

Technical Note, Monitoring Ready/Busy Status in 2Gb, 4Gb, and 8Gb Micron NAND Flash Devices, Micron Technology, Inc, 2005.*

*Primary Examiner* — Kalpit Parikh
(74) *Attorney, Agent, or Firm* — Harness, Dickey & Pierce, P.L.C.

(57) ABSTRACT

In one embodiment, the method includes sensing, by a memory device, a temperature of the memory device; and generating, by the memory device, a response to a single received command. The response includes temperature information, and the temperature information provides information on the sensed temperature. In one embodiment, the single received command is a read status request command, the read status request command requests status information on the memory device, and the status information includes the temperature information.

20 Claims, 35 Drawing Sheets

(51) Int. Cl.
*G11C 11/56* (2006.01)
*G11C 16/10* (2006.01)
*G11C 16/14* (2006.01)
*G11C 16/26* (2006.01)
*G11C 16/32* (2006.01)
*G11C 16/34* (2006.01)
*G11C 7/10* (2006.01)
*G11C 16/04* (2006.01)

(52) U.S. Cl.
CPC ...... *G11C 11/5635* (2013.01); *G11C 11/5642* (2013.01); *G11C 16/10* (2013.01); *G11C 16/14* (2013.01); *G11C 16/26* (2013.01); *G11C 16/32* (2013.01); *G11C 16/3418* (2013.01); *G11C 16/3459* (2013.01); *G11C 16/0483* (2013.01)

(56) References Cited

U.S. PATENT DOCUMENTS

| | | | |
|---|---|---|---|
| 7,630,266 B2 | 12/2009 | Incarnati et al. | |
| 7,755,946 B2 | 7/2010 | Dunga et al. | |
| 7,817,467 B2 | 10/2010 | Roohparvar et al. | |
| 7,881,117 B2 | 2/2011 | Kim | |
| 8,023,324 B2 | 9/2011 | Roohparvar et al. | |
| 8,027,194 B2 | 9/2011 | Lee et al. | |
| 8,213,255 B2 | 7/2012 | Hemink et al. | |
| 8,379,446 B2 | 2/2013 | Roohparvar et al. | |
| 8,565,021 B2 | 10/2013 | Lee et al. | |
| 8,611,166 B2 | 12/2013 | Shinozaki | |
| 8,614,919 B2 | 12/2013 | Lee et al. | |
| 8,625,344 B2 | 1/2014 | Lee et al. | |
| 8,638,585 B2 | 1/2014 | Lee et al. | |
| 8,659,966 B2 | 2/2014 | Choi et al. | |
| 8,693,246 B2 | 4/2014 | Roohparvar et al. | |
| 8,705,272 B2 | 4/2014 | Lee et al. | |
| 8,760,918 B2 | 6/2014 | Lee et al. | |
| 2007/0047378 A1* | 3/2007 | Wolford | G11C 7/1045 365/189.15 |
| 2007/0109013 A1* | 5/2007 | Lee | G01K 7/42 326/32 |
| 2009/0052268 A1* | 2/2009 | Janzen | G01K 7/00 365/230.02 |
| 2009/0089492 A1* | 4/2009 | Yoon | G06F 13/1689 711/103 |
| 2010/0091567 A1* | 4/2010 | Tran | G11C 11/5621 365/185.03 |
| 2011/0223674 A1 | 9/2011 | James et al. | |
| 2012/0236670 A1 | 9/2012 | Hemink et al. | |
| 2012/0287711 A1 | 11/2012 | Kim et al. | |
| 2012/0297121 A1 | 11/2012 | Gorobets et al. | |
| 2012/0297122 A1 | 11/2012 | Gorobets et al. | |
| 2013/0024609 A1 | 1/2013 | Gorobets et al. | |
| 2013/0080858 A1* | 3/2013 | Lee | G11C 16/26 714/773 |
| 2013/0223143 A1 | 8/2013 | Cho et al. | |
| 2013/0241706 A1* | 9/2013 | Kobayashi | G06F 17/30218 340/10.4 |
| 2014/0140130 A1 | 5/2014 | Song et al. | |
| 2014/0169101 A1 | 6/2014 | Choi et al. | |

FOREIGN PATENT DOCUMENTS

| | | |
|---|---|---|
| KR | 20090129622 A | 12/2009 |
| KR | 20100065364 A | 6/2010 |
| KR | 20120056424 A | 6/2012 |
| KR | 20120125791 A | 11/2012 |
| KR | 20130045243 A | 5/2013 |
| KR | 20130072712 A | 7/2013 |
| KR | 20130099496 A | 9/2013 |
| KR | 20140035916 A | 3/2014 |
| KR | 20140065185 A | 5/2014 |

* cited by examiner

FIG. 10

| INDEX | TEMPERATURE RANGE |
|---|---|
| 1 | SVAL < A |
| 2 | A <= SVAL < B |
| 3 | B <= SVAL < C |
| ⋮ | ⋮ |

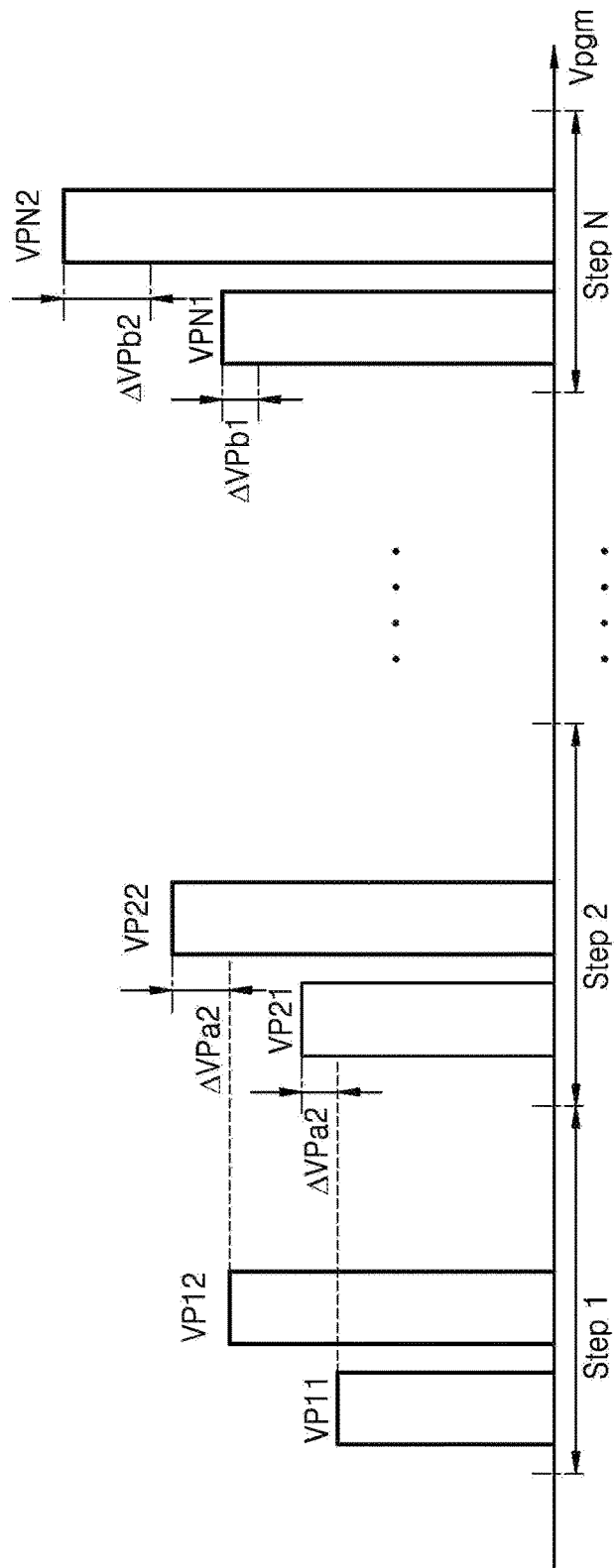

FIG. 18

| | DQ0 | DQ1 | DQ2 | DQ3 | DQ4 | DQ5 | DQ6 | DQ7 |
|---|---|---|---|---|---|---|---|---|
| Definition of value | Pass : "0"<br>Fail : "1" | Pass : "0"<br>Fail : "1" | Reserved | Reserved | Reserved | Busy : "0"<br>Ready : "1" | Busy : "0"<br>Ready : "1" | Protected : "0"<br>Not Protected : "1" |
| Block Erase | Pass/Fail | Not Use | Not Use | Not Use | Not Use | Not Use | Busy/Ready | Write Protect |
| Page Program | Pass/Fail | Not Use | Not Use | Not Use | Not Use | Not Use | Busy/Ready | Write Protect |
| Cache Program | Pass/Fail for the current page | Pass/Fail for the current page | Not Use | Not Use | Not Use | Busy/Ready for Flash array | Busy/Ready for Host | Write Protect |
| Read | Not Use | Not Use | Not Use | Not Use | Not Use | Not Ready for New Command*:"0"<br>Ready For New command*:"1" | Busy/Ready | Write Protect |
| Cache Read | Not Use | Not Use | Not Use | Not Use | Not Use | Busy/Ready for Flash array | Busy/Ready for Host | Write Protect |

MEMORY DEVICE, MEMORY SYSTEM, AND METHOD OF CONTROLLING MEMORY DEVICE

CROSS-REFERENCE TO RELATED APPLICATION

This application claims the benefit of Korean Patent Application No. 10-2014-0132018, filed on Sep. 30, 2014, in the Korean Intellectual Property Office, the disclosure of which is incorporated herein in its entirety by reference.

BACKGROUND

The inventive concepts relate to a memory device, a memory system, and/or a method of controlling the memory device, which may easily and/or precisely check temperature information and control a temperature.

Memory devices have become highly integrated or downscaled. Thus, the influence of a variation in temperature has been on the increase. Accordingly, it is desirable to control a memory device based on a temperature of the memory device. For example, a read voltage of the memory device may be set differently according to the temperature of the memory device.

SUMMARY

The inventive concepts provide a memory device, a memory system, and/or a method of controlling the memory device, which may easily and/or precisely check temperature information and control a temperature.

At least one embodiment relates to a method.

In one embodiment, the method includes sensing, by a memory device, a temperature of the memory device; and generating, by the memory device, a response to a single received command. The response includes temperature information, and the temperature information provides information on the sensed temperature.

In one embodiment, the single received command is a temperature information request command, and the temperature information request command requests the temperature information.

In one embodiment, the single received command is a read status request command, the read status request command requests status information on the memory device, and the status information includes the temperature information.

In one embodiment, the response includes status information on the memory device, and the status information includes the temperature information.

In one embodiment, the status information further includes read status information indicating whether the memory device is one of busy and ready.

In one embodiment, the method further includes receiving the single received command anytime.

In one embodiment, the method further includes receiving the single received command regardless of whether the memory device is in a ready status.

In one embodiment, the temperature information is one of a plurality of index values, and each of the plurality of index values is associated with a different temperature range.

In one embodiment, the different temperature ranges are programmable.

In one embodiment, the method includes storing temperature range information in the memory device at power down of the memory device, where the temperature range information indicates the different temperature ranges. The method may further include loading the temperature range information stored in the memory device into one or more registers at power on of the memory device.

In one embodiment, the sensing is triggered by receiving at least one of a program command, a read command and an erase command.

In one embodiment, the method may include storing the sensed temperature; and for a plurality of sensed temperatures, the temperature information indicates the sensed temperature triggered by the program command.

In another embodiment, the temperature information indicates a most recently sensed temperature.

In a further embodiment, the temperature information indicates more than on sensed temperature, each of the sensed temperatures associated with a different time prior to receiving the singled received command.

In one embodiment, the sensing is triggered by receiving the single received command.

In one embodiment, the sensing senses the temperature periodically.

In one embodiment, the memory device is a vertical NAND memory device.

In another embodiment, the method includes sensing, by a memory device, a temperature of the memory device; and generating, by the memory device, a response to a read status command. The response includes status information, and the status information indicates the sensed temperature is within a first range if the status information does not include temperature information, and the status information indicates the sensed temperature is within at least one range other than the first range if the status information includes the temperature information. Here, the temperature information indicates the at least one other range.

In one embodiment, the method further includes receiving the read status command regardless of whether the memory device is in a ready status.

In one embodiment, the temperature information is one of a plurality of index values, and each of the plurality of index values is associated with a different temperature range.

In one embodiment, the sensing is triggered by receiving the read status command.

In one embodiment, the sensing is triggered by receiving at least one of a program command, a read command and an erase command.

In one embodiment, the method further includes storing the sensed temperature; and for a plurality of sensed temperatures, the temperature information indicates the sensed temperature triggered by the program command.

In another embodiment, the method includes sending, by a controller, a single command to a memory device regardless of a ready status of the memory device; receiving, by the controller, temperature information in response to the single command; and selectively changing, by the controller, at least one memory control characteristic for the memory device based on the temperature information.

In one embodiment, the single command is a temperature information request command, and the temperature information request command requests the temperature information.

In one embodiment, the single command is a read status request command, and the read status request command requests status information on the memory device. Here, the receiving receives the status information including the temperature information.

In one embodiment, the response includes status information on the memory device, and the status information includes the temperature information.

In one embodiment, the status information further includes read status information indicating whether the memory device is one of busy and ready.

In one embodiment, the temperature information indicates one range of temperatures from a plurality of different ranges.

In one embodiment, the method further includes programing one or more of the plurality of different ranges.

In one embodiment, the method further includes programming the memory device to change one or more of the plurality of different ranges.

In one embodiment, the memory control characteristic includes one of read voltages, incremental step pulse program voltages, erase voltages, program verify voltages, and duration to apply voltages to the memory device.

In yet another embodiment, the method includes sensing, by a memory device, a temperature of the memory device in response to receiving at least one of a program command, a read command and an erase command.

In an additional embodiment, the method includes sensing, by a memory device, a temperature of the memory device in response to receiving a single received command, and the single received command requests one of status information and temperature information.

At least one embodiment relates to a memory device.

In one embodiment, the memory device includes a temperature sensor configured to sense a temperature of the memory device; and control logic configured to generate a response to a single received command. The response includes temperature information, and the temperature information provides information on the sensed temperature.

At least one embodiment relates to a memory controller.

In one embodiment, the memory controller is configured to send a single command to a memory device regardless of a ready status of the memory device, receive temperature information in response to the single command, and selectively change at least one memory control characteristic for the memory device based on the temperature information.

BRIEF DESCRIPTION OF THE DRAWINGS

Example embodiments of the inventive concepts will be more clearly understood from the following detailed description taken in conjunction with the accompanying drawings in which:

FIG. 10 is a diagram of temperature ranges according to an example embodiment of the inventive concepts;

FIGS. 13, 14, 15, 16A, 16B and 16C are diagrams illustrating methods of executing an operation command, which is differently set based on temperature information, in a memory device according to example embodiments of the inventive concepts;

FIG. 18 is a diagram of conditions in which the response of FIG. 17 is output;

DETAILED DESCRIPTION OF THE EMBODIMENTS

Figure 1:
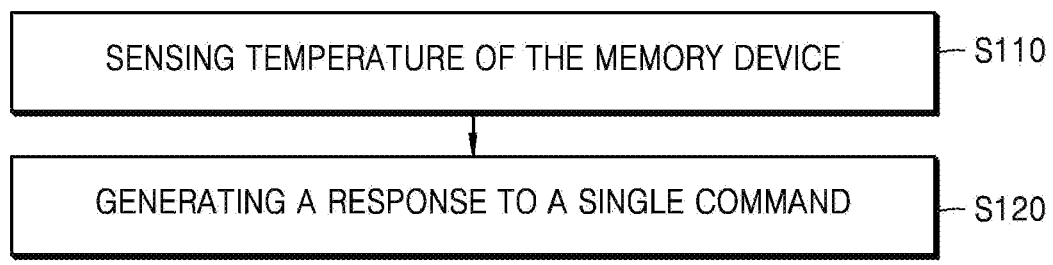
FIG. 1 is a flowchart illustrating a method of controlling a memory device according to an example embodiment of the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments of the inventive concepts are described herein with reference to schematic illustrations of idealized embodiments (and intermediate structures) of the inventive concepts. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

FIG. 1 is a flowchart illustrating a method of controlling a memory device according to an example embodiment of the inventive concepts. Referring to FIG. 1, the method includes sensing, by the memory device, a temperature of the memory device (S110). The sensing may be triggered by one or more various commands. For example, a read command, a program command, an erase command, a reset command, etc. may trigger the sensing.

Still referring to FIG. 1, the method further includes generating, by the memory device, a response to a single received command (S120). The response may include temperature information, and the temperature information provides information on the sensed temperature. In one embodiment, the response may be to a particular command, for example to a read status command. A response to a read status command includes status information, and the status information may indicate the sensed temperature is within a first range if the status information does not include temperature information. Otherwise, the status information indicates the sensed temperature is within at least one range other than the first range if the status information includes the temperature information, and the temperature information indicates the at least one other range. In one embodiment, the status information further includes read status information indicating whether the memory device is one of busy and ready.

Instead of a read status request, the single received command may be a temperature information request command, and the temperature information request command requests the temperature information.

In these embodiments, the single received command may be received anytime. Namely, the single received command may be received regardless of whether the memory device is in a ready status.

Figure 2:
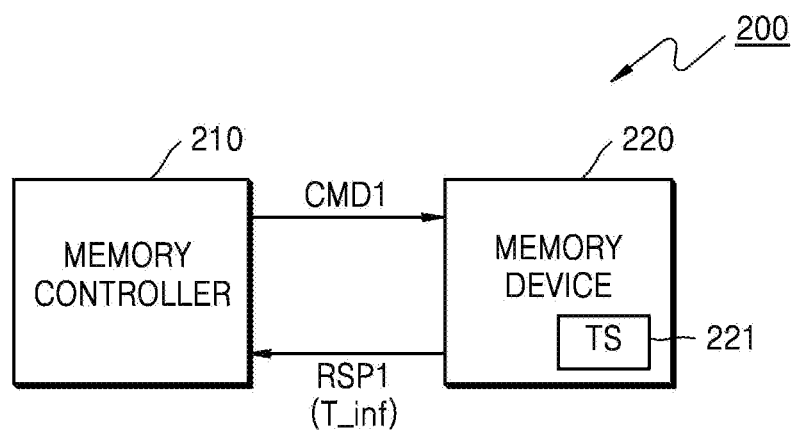
FIG. 2 is a diagram of a memory system according to an example embodiment of the inventive concepts.

The method of controlling the memory device described in FIG. 1 may be performed by a memory system of FIG. 2. However, the inventive concepts are not limited thereto, and the method of controlling the memory device described in FIG. 1 may be performed by an external host.

FIG. 2 is a diagram of a memory system 200 according to an example embodiment of the inventive concepts. The memory system 200 may include a memory controller 210 and a memory device 220. The memory controller 210 may apply various control signals, commands, addresses, and data for controlling the memory device 220 to the memory device 220, and receive responses from the memory device 220 in response to the commands. The memory controller 210 may apply control signals, such as a chip enable signal indicating the enabling of the memory device 220, to the memory device 220. For example, the memory controller 210 may apply operation commands indicating operations of the memory device 220 (e.g., a program command, a read command, and an erase command) to the memory device 220. For example, the memory controller 210 may apply data to be programmed to the memory device 220 along with an address.

The memory device 220 may receive control signals, commands, and data from the memory controller 210 and perform operations corresponding thereto. For example, the memory device 220 may be enabled in response to a chip enable signal applied from the memory controller 210. For instance, the memory device 220 may store data, which is applied from the memory controller 210 in response to a program command applied from the memory controller 210, in a storage region of the memory device 220 corresponding to the address applied from the memory controller 210. For example, the memory device 220 may transmit the data stored in the storage region of the memory device 220 to the memory controller 210 in response to a read command applied from the memory controller 210. As further shown, the memory device 220 may include a temperature sensor 221. The temperature sensor 221 will be described in detail below with respect to FIG. 4.

Figure 3:
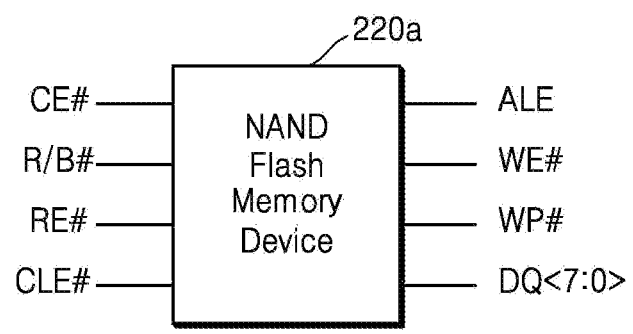
FIGS. 3 and 4 are diagrams of memory devices according to example embodiments of the inventive concepts.

FIG. 3 is a diagram of a memory device according to an example embodiment of the inventive concepts. FIG. 3 illustrates an example in which the memory device 220 of FIG. 2 is embodied by a NAND flash memory device 220a. However, the inventive concepts are not limited thereto. In addition to the NAND flash memory device 220a, the memory device 220 of FIG. 2 may be embodied by volatile memory devices, such as a dynamic random access memory (DRAM) and a static RAM (SRAM), or non-volatile memory devices, such as a phase-change RAM (PRAM), a magnetic RAM (MRAM), and a resistive RAM (RRAM).

The NAND flash memory device 220a may include various pins. For example, the NAND flash memory device 220a may include a pin R/B# from which a ready/busy signal is output, a pin CE# to which the above-described chip enable signal is input, a pin CLE# to which a command latch enable signal is input, a pin ALE to which an address latch enable signal is input, a pin WE# to which a write enable signal is input, a pin WP# to which a write protect signal is input, and a data input/output (I/O) pin DQ connected to a data bus.

As described above, the chip enable signal may indicate the enabling of the NAND flash memory device 220a. The ready/busy signal may inform the memory controller 210 that the NAND flash memory device 220a is in a target status. The read enable signal may enable the output of serial data. The command latch enable signal may inform the NAND flash memory device 220a of a bus clock used for the input of a command. The address latch enable signal may inform the NAND flash memory device 220a of a bus clock used for the input of an address. The write enable signal may control an operation of latching the input of data. When the write enable signal rises to a logic high, data, commands, and addresses may be latched. The write protect signal may disable write and erase operations of the NAND flash memory device 220a. The commands, data, and the addresses may be input to the data I/O pin DQ, and responses in response to the commands may be output from the data I/O pin DQ. A first command CMD1 and a response RSP1 of FIG. 2 may be respectively input to and output from the data I/O pin DQ. FIG. 2 illustrates an example in which the memory controller 210 applies the first command CMD1 to the memory device 220, and the memory device 220 applies the response RSP1 to the memory controller 210 in response to the first command CMD1.

Referring back to FIGS. 1 and 2, the operation S110 of sensing the temperature may be performed by the memory device 220. To this end, the memory device 220 may be embodied as shown in FIG. 4.

Figure 4:
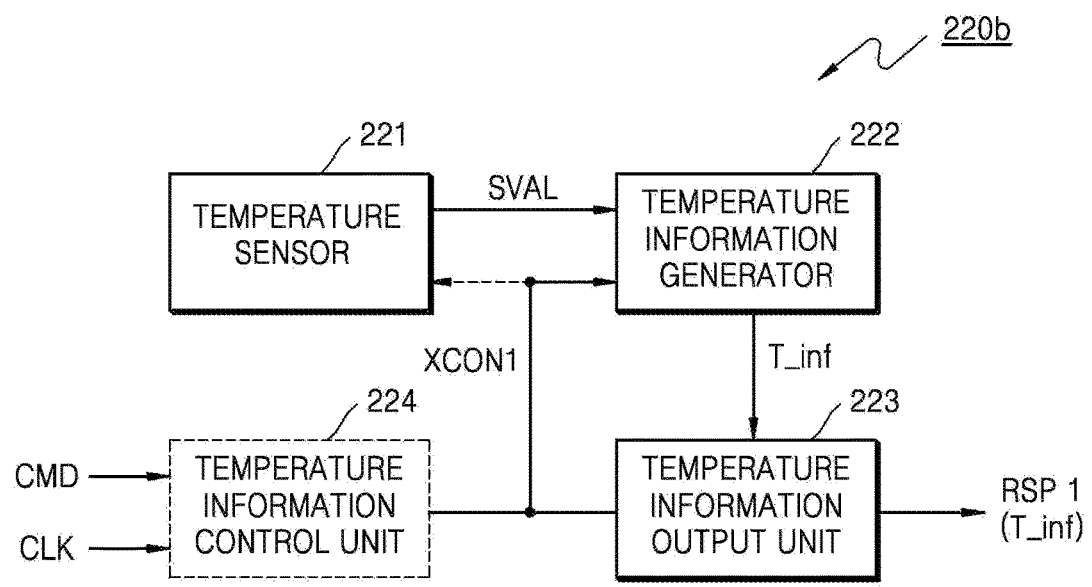

FIG. 4 is a diagram of portions a memory device 220b according to an example embodiment of the inventive concepts. As will be appreciated, for the purposes of clarity only, FIG. 4 does not illustrate all the components of a memory device, and instead only shows those portions for sensing temperature and generating temperature information. Referring to FIG. 4, the memory device 220b may include a temperature sensor 221, a temperature information generator 222, and a temperature information output unit 223. The temperature sensor 221 may sense a temperature of the memory device 220b and output the sensed temperature as a temperature sensing value SVAL of an analog value or a digital value. The temperature information generator 222 may receive the temperature sensing value SVAL from the temperature sensor 221 and generate temperature information T_inf corresponding to the temperature sensing value SVAL. The temperature information generator 222 may generate the temperature sensing value SVAL itself or generate temperature information T_inf as a value corresponding to the temperature sensing value SVAL. The temperature information output unit 223 may receive the temperature information T_inf from the temperature information generator 222, include the temperature information T_inf in the response RSP1, and output the response RSP1 including the temperature information T_inf. The temperature information output unit 223 may include the temperature information T_inf in a reserved bit of the response RSP1. Operations of the temperature information output unit 223 will be described in further detail below. The temperatures sensor 221 may be any well-known temperature sensing device, for example in integrated temperature sensor producing a current or voltage proportional to the sensed temperature. The temperature information generator 22, the temperature information output unit 223 and the temperature information control unit 224 may be hardware logic circuits configured by firmware.

Figure 5:
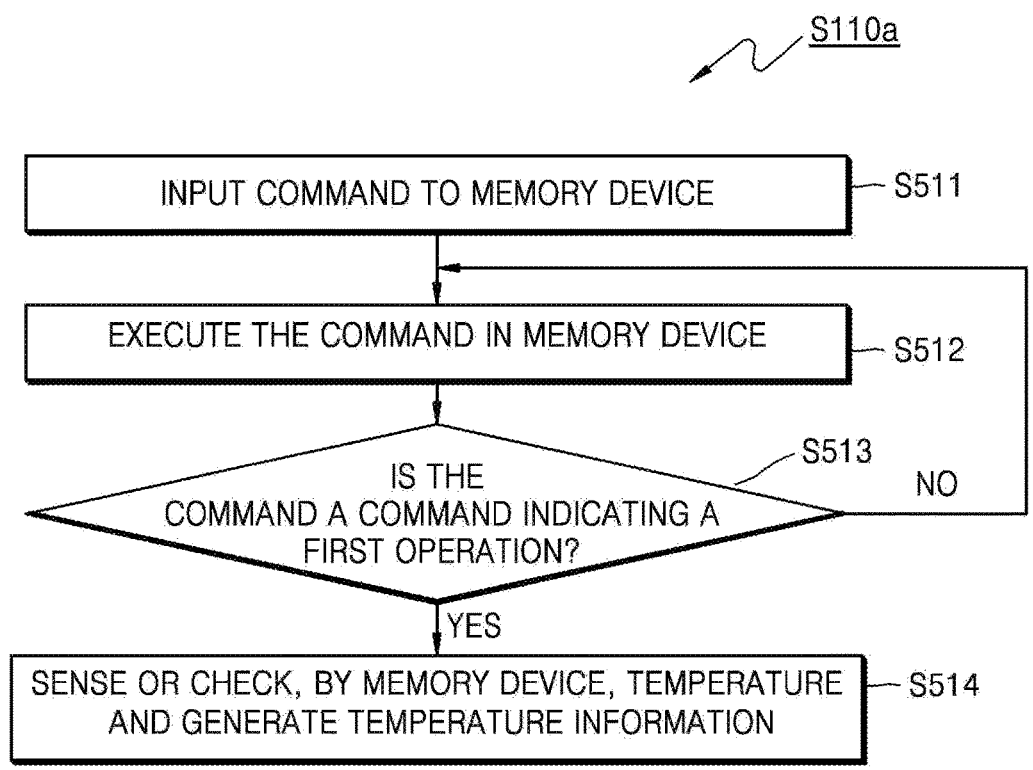
FIGS. 5 through 7 are flowcharts illustrating methods of triggering temperature information generation according to example embodiments of the inventive concepts.
Figure 6:
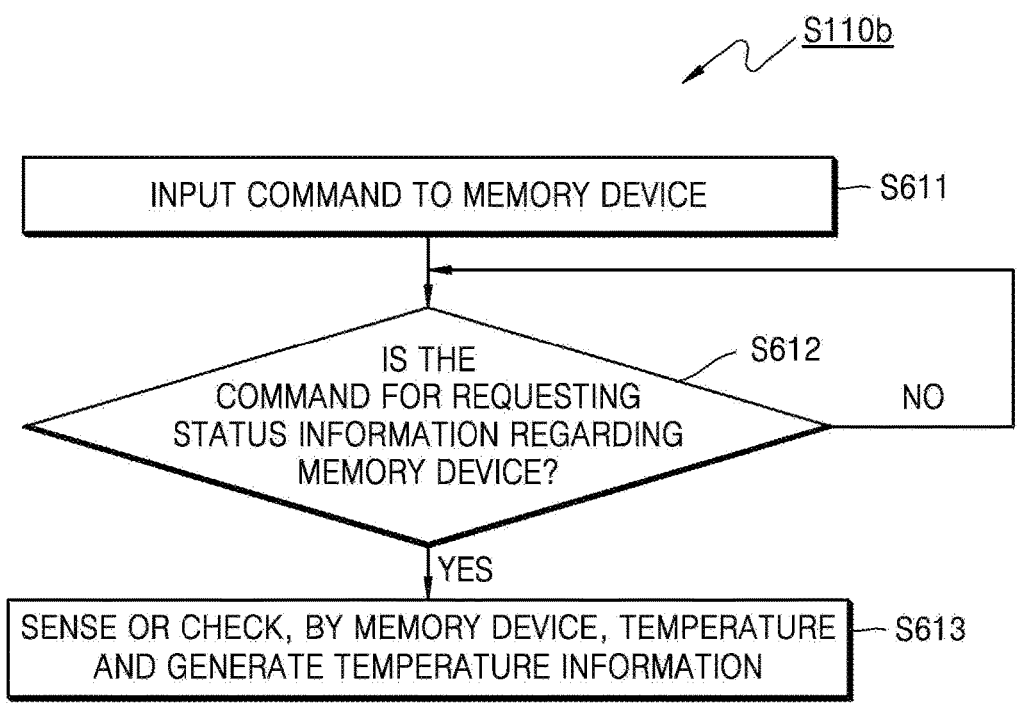
Figure 7:
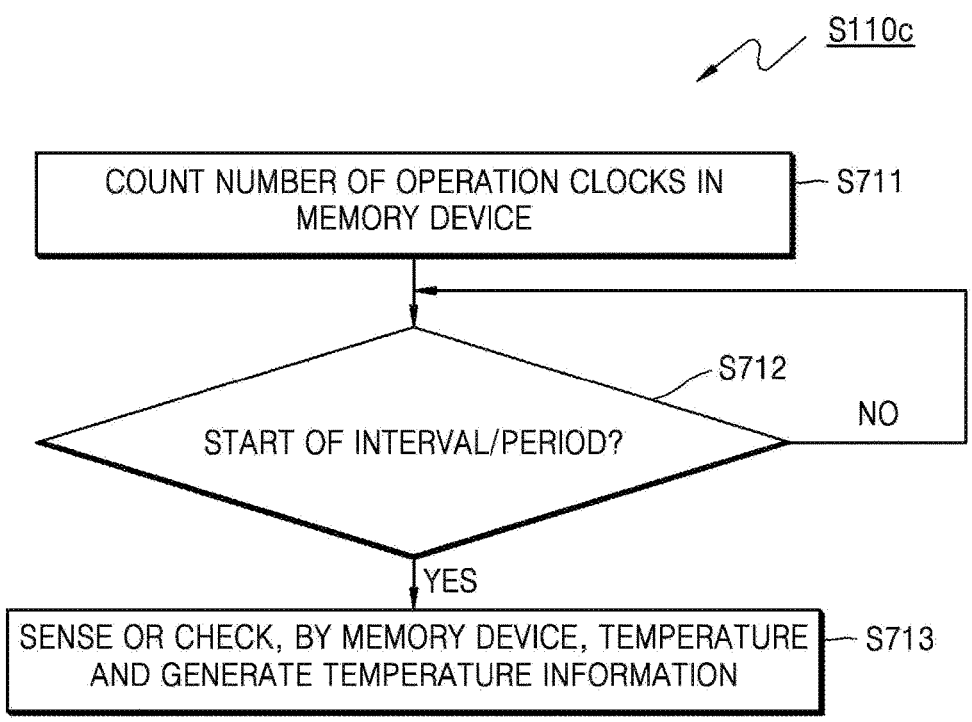

Generating the temperature information T_inf according to an example embodiment of the inventive concepts may be triggered using various methods. FIGS. 5 through 7 are flowcharts illustrating methods of triggering temperature information generation according to example embodiments of the inventive concepts. The methods illustrated in FIGS. 5 through 7 may be performed by the memory device 220b of FIG. 4. However, the inventive concepts are not limited thereto, and the methods illustrated in FIGS. 5 through 7 may be performed by another memory device according to an example embodiment of the inventive concepts.

To begin with, referring to FIGS. 4 and 5, a method S110a of sensing or sensing or checking temperature and generating temperature information T_inf according to an example embodiment of the inventive concepts may include generating the temperature information T_inf by sensing or checking temperature when the memory device 220b performs a operation, based on a temperature sensing value SVAL obtained when the memory device 220b performs the operation. Specifically, the method S110a may include an operation S511 of inputting a command CMD to the memory device 220b, an operation S512 of executing, by the memory device 220b, the command CMD, an operation S513 of determining whether the command CMD is a command indicating the operation, and an operation (S514) of, by the memory device 220b, sensing temperature and generating the temperature information T_inf when the command CMD is the command indicating the operation (refer to YES of S513).

As described above, the memory device 220b may receive various commands (S511) and perform operations corresponding thereto (S512). In this case, the memory device 220b may determine whether a command CMD is the command indicating the operation (S513). For instance, when the operation is set to a program operation, it may be determined whether the command CMD is a program command. When the command CMD is the program command (refer to YES of S513), temperature information T_inf may be generated (S514). In this case, the temperature information T_inf may be generated as a temperature of the memory device 220b, which is measured when a final program operation is performed by the memory device 220b.

Alternatively, for example, when the operation is set to a read operation, the memory device 220b may determine whether the command CMD is a read command. When the command CMD is the read command (refer to YES of S513), temperature information T_inf may be generated (S514). In this case, the temperature information T_inf may be generated as a temperature of the memory device 220b, which is measured when a final read operation is performed by the memory device 220b. Alternatively, for example, when the operation is set to an erase operation, the memory device 220b may determine whether the command CMD is an erase command. When the command CMD is the erase command (refer to YES of S513), temperature information T_inf may be generated (S514). In this case, the temperature information T_inf may be generated as a temperature of the memory device 220b, which is measured when a final erase operation is performed in the memory device 220b.

To enable the above-described operation, the memory device 220b may further include a temperature information control unit 224 as shown in FIG. 4. The temperature information control unit 224 is control logic configured to receive a command CMD, determine whether the command CMD is the command indicating the operation, and generate a first control signal XCON1 for enabling the temperature information generator 222 when the command CMD is the command indicating the operation. The temperature information generator 222 may generate temperature information T_inf based on a temperature sensing value SVAL received with the application of the command CMD. In this case, the first control signal XCON1 may be applied to the temperature sensor 221. The temperature sensor 221 may generate the temperature sensing value SVAL and reduce power consumption only during the enabling of the first control signal XCON1.

In addition, for example, when the operation is set to a reset operation, the memory device 220b may determine whether the command CMD is a reset command, and if so, temperature information T_inf may be generated to indicate a temperature of the memory device 220b, which is measured when the reset operation is performed.

Furthermore, in one embodiment, more than one operation may be designated as the operation triggering sensing the temperature.

In the memory device, the memory system, and/or the method of controlling the memory device according to example embodiments of the inventive concepts, a basis for a status or point in time for determining a temperature variation in the memory device may be variously set as required. For example, when a program operation of the memory device is particularly greatly affected by a temperature variation, in the memory device, memory system, and/or method of controlling the memory device according to the example embodiments of the inventive concepts, the memory device may be controlled based on a temperature variation in the program operation. Accordingly, the memory device, memory system, and/or method of controlling the memory device according to the example embodiments of the inventive concepts may improve or optimize the control of the memory device.

Next, referring to FIGS. 4 and 6, a method S110b of sensing or checking a temperature and generating temperature information T_inf according to an example embodiment of the inventive concepts may include inputting a command CMD to a memory device 220b (S611), determining whether the command CMD is a command for requesting status information regarding the memory device 220b (S612), and sensing or checking, by the memory device 220b, a temperature and generating temperature information T_inf when the command CMD is the command for requesting status information regarding the memory device 220b (refer to YES of S612). For example, when the memory device 220b is the NAND flash memory device 220a of FIG. 3, the command for requesting the status information regarding the memory device 220b may be a read status command.

In this case, the temperature information T_inf may be generated as a temperature of the memory device 220b, which is measured when the memory device 220b receives the read status command. In the method of controlling the memory device according to the present embodiment as shown in FIG. 1, the read status command may be set as the first command CMD1, and a response to the read status command may be set as a response RSP1, which will be described below in further detail. When the command CMD is the command for requesting status information, the temperature information control unit 224 may generate the above-described first control signal XCON1.

As described below, a read status command and a response to the read status command may be generated each time a desired (or alternatively, a predetermined) number of normal operations are performed (e.g., each time the desired number of operation commands are processed) between a memory controller and a memory device. For example, a response to a read status command may be generated each time one read command is processed. Alternatively, after one program command and two read commands are processed, a response to a read status command may be generated to indicate a status of processing the final read command. Therefore, in the memory device, the memory system, and/or the method of controlling the memory device according to the present embodiment, a temperature variation in the memory device may be checked at all times without causing overhead, thereby enabling more precise control of the memory device.

Next, referring to FIGS. 4 and 7, a method S110c of sensing or checking a temperature and generating temperature information T_inf according to an example embodiment of the inventive concepts may include counting the number of operation clocks CLK in the memory device 220b (S711), determining whether a start of a periodic interval has begun based on the counting result (S712), and sensing or checking, by the memory device 220b, a temperature and generating the temperature information T_inf when the start of an interval or period has begun (refer to YES of S712) (S713). The temperature information control unit 224 may count the number of operation clocks (CLK) and generate a first control signal XCON1 periodically.

The period may be differently set according to required control of a temperature variation of the memory device 220b. For instance, when a program/erase (P/E) cycle of the memory device 220b is less than or equal to a reference value, the influence of the temperature variation of the memory device 220b may be less than when the P/E cycle of the memory device 220b is larger than the reference value. Accordingly, the period/interval set when the P/E cycle of the memory device 220b is less than or equal to the reference value may be longer than the period/interval set when the P/E cycle of the memory device 220b is larger than the reference value. Therefore, according to a memory device and memory system configured to operate using the method S110c of generating temperature information T_inf as shown in FIG. 7 and a method of controlling the memory device including the method S110c of generating the temperature information T_inf as shown in FIG. 7, a temperature variation of the memory device may be checked at an interval or period which corresponds to a status of the memory device, thereby enabling efficient and/or precise control of the memory device.

Furthermore, it will be appreciated that the embodiments of FIGS. 5-7 may be employed in combination with one another.

Figure 8A:
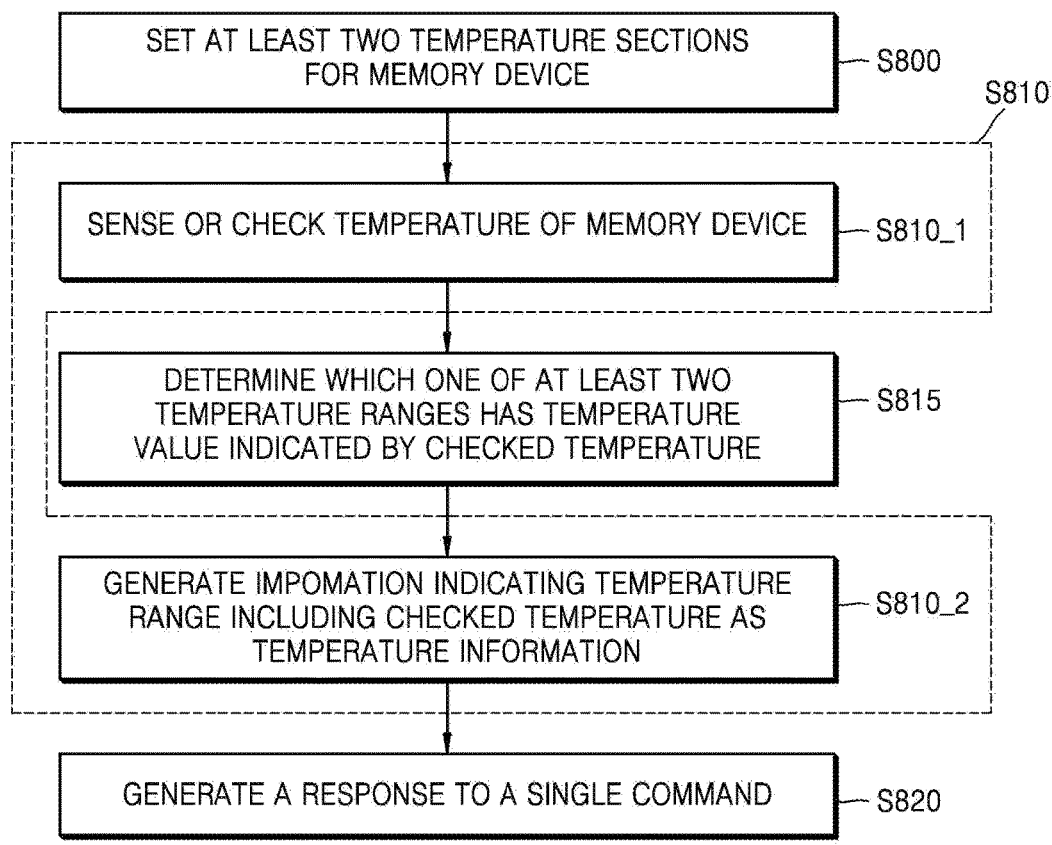
FIG. 8A is a flowchart illustrating a method of controlling a memory device according to an example embodiment of the inventive concepts.
Figure 8B:
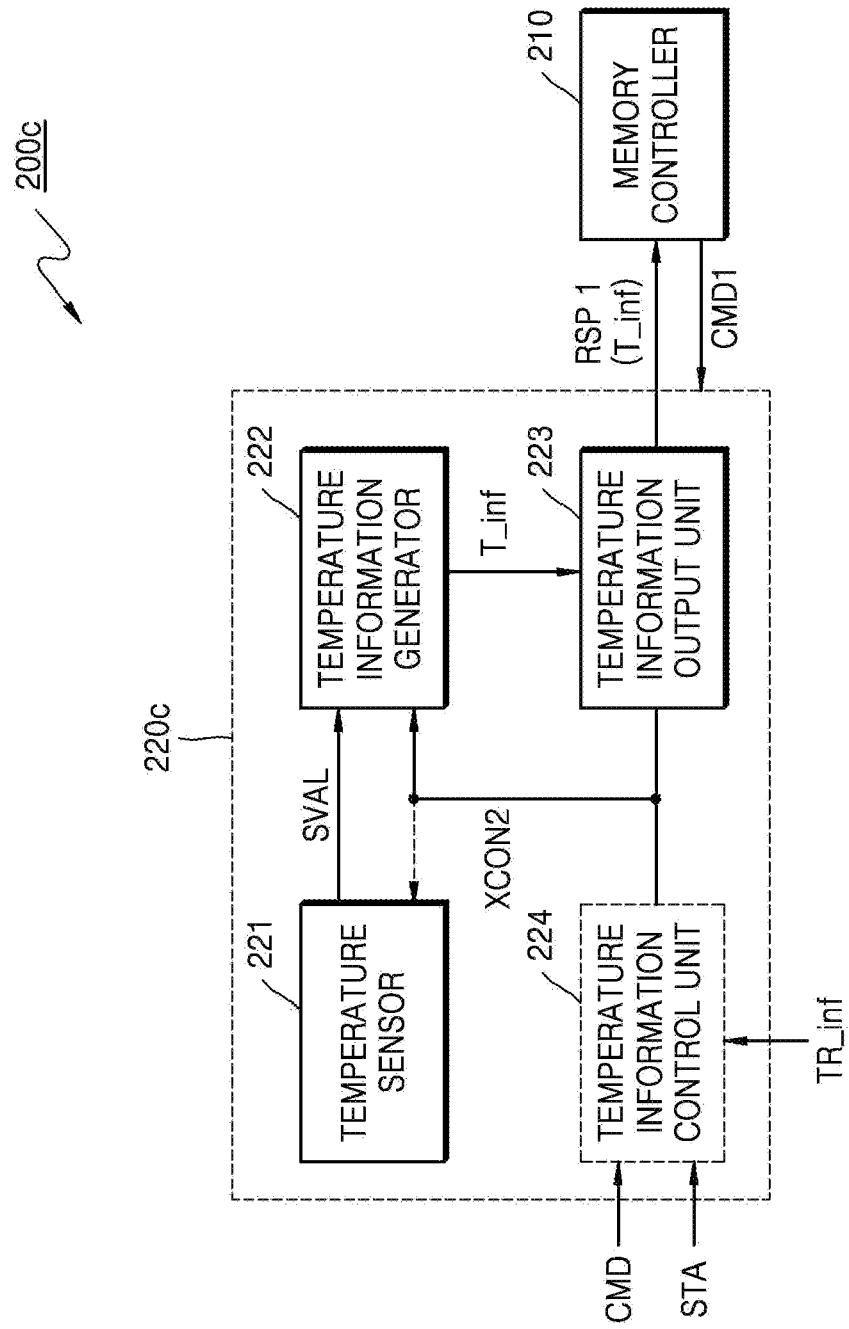
FIG. 8B is a diagram of a memory system according to an example embodiment of the inventive concepts.

FIG. 8A is a flowchart illustrating a method of controlling a memory device according to an example embodiment of the inventive concepts, and FIG. 8B is a diagram of a memory system 200c according to an example embodiment of the inventive concepts. The method shown in FIG. 8A may be performed by the memory system 200c of FIG. 8B. However, the inventive concepts are not limited thereto, and the method of FIG. 8A may be performed by a memory system according to another example embodiment of the inventive concepts.

Referring to FIGS. 8A and 8B, like the method of controlling the memory device as shown in FIG. 1, the method of controlling the memory device according to the present embodiment may include generating a checked or sensed temperature (e.g., a temperature sensing value SVAL) of the memory device 220c as temperature information T_inf (S810), and outputting a response RSP1 including the temperature information T_inf in response to a single received command CMD1 input to the memory device 220c (S820). Also, like in the method of controlling the memory device of FIG. 1, the response RSP1 may be a response informing whether the memory device is in a ready status in which the memory device may receive an operation command and perform an operation. Furthermore, like FIG. 1 the command CMD1 may be input anytime, and may be input regardless of whether the memory device is in a ready status.

The method of controlling the memory device as shown in FIG. 8A may further include establishing at least two temperature ranges for the memory device 220c (S800), and determining which one of the at least two temperature ranges has a temperature value indicated by the checked temperature (e.g., the temperature sensing value SVAL) (S815). Also, the operation S810 of generating the sensed or checked temperature (e.g., the temperature sensing value SVAL) of the memory device 220c as the temperature information T_inf may include sensing or checking (sensing) a temperature of the memory device 220c (S810_1), and generating information indicating a temperature range including the checked temperature (e.g., the temperature sensing value SVAL) as the temperature information T_inf (S810_2).

A temperature information generator 222 may generate one or both of the temperature range information and the temperature sensing value SVAL as the temperature information T_inf in response to a second control signal XCON2 applied from a temperature information control unit 224. For instance, the temperature information control unit 224 may instruct the temperature information generator 222 and the temperature information output unit 223 to indicate the temperature range in the temperature information (T_inf) using the second control signal XCON2. However, when the information regarding the temperature range is received and stored in the temperature information generator 222 by the temperature information generator 222, unless the information regarding the temperature range is changed, the information may not be stored. Alternatively, although not shown, a storage unit configured to store the temperature and/or temperature information may be further provided in the memory device 220c.

The number of temperature ranges and values of the temperature ranges may be variously set. For example, any well-known command for setting features of a memory device 220 may be used. For example, the temperature information control unit 224 may generate the second control signal XCON2 in response to a command for setting a temperature range, which is applied from a memory controller 210. For example, when an error rate of the memory device 220c increases in a specific temperature range, the command for setting the temperature range may be applied by the memory controller 210 to the memory device 220c to control (e.g., reduce) the increase of the error rate. For example, the command for setting the temperature range may be applied to the memory device 220c in a first mode in which the memory controller 210 performs a set feature on the memory device 220c, which is different from a normal mode in which the memory device 220c performs general operations (e.g., program, read, erase, and reset operations).

Alternatively, the temperature information control unit 224 may generate the second control signal XON2 in response to information (e.g., trim information (TR_inf)) set during mass production of the memory device 220c. The trim information TR_inf may be set depending on proper characteristics of the memory device 220c based on fabrication environments. For instance, when the memory device 220c is largely affected by a temperature variation in a specific temperature range, the trim information TR_inf may be generated by subdividing the corresponding temperature range. The trim information TR_inf may be generated during a calibration process for determining a digital temperature value to be matched with an analog temperature value sensed by a temperature sensor of the memory device 220c. For example, the memory device may be tested during manufacture. Through this empirical testing, the temperature ranges and trim (e.g., control characteristics or values like read voltages, etc.) for temperature ranges that reduce or minimize errors are empirically determined and programmed into the memory device.

Alternatively, the temperature information control unit 224 may set a temperature range on its own and generate the second control signal XCON2. For example, the temperature information control unit 224 may set the temperature range based on status information STA of the memory device 220c. For example, in the memory device 220c, when errors frequently occur during a program operation of the memory device 220c in a specific temperature range, status information STA indicating the frequent occurrence of the errors may be generated. In this case, the temperature information control unit 224 may subdivide and set the corresponding temperature range in response to the status information STA. Therefore, in the memory device, the memory system, and/or the method of controlling the memory device according to the present embodiment, the control of the memory device may be improved or optimized depending on circumstances of the memory device.

Figure 9:
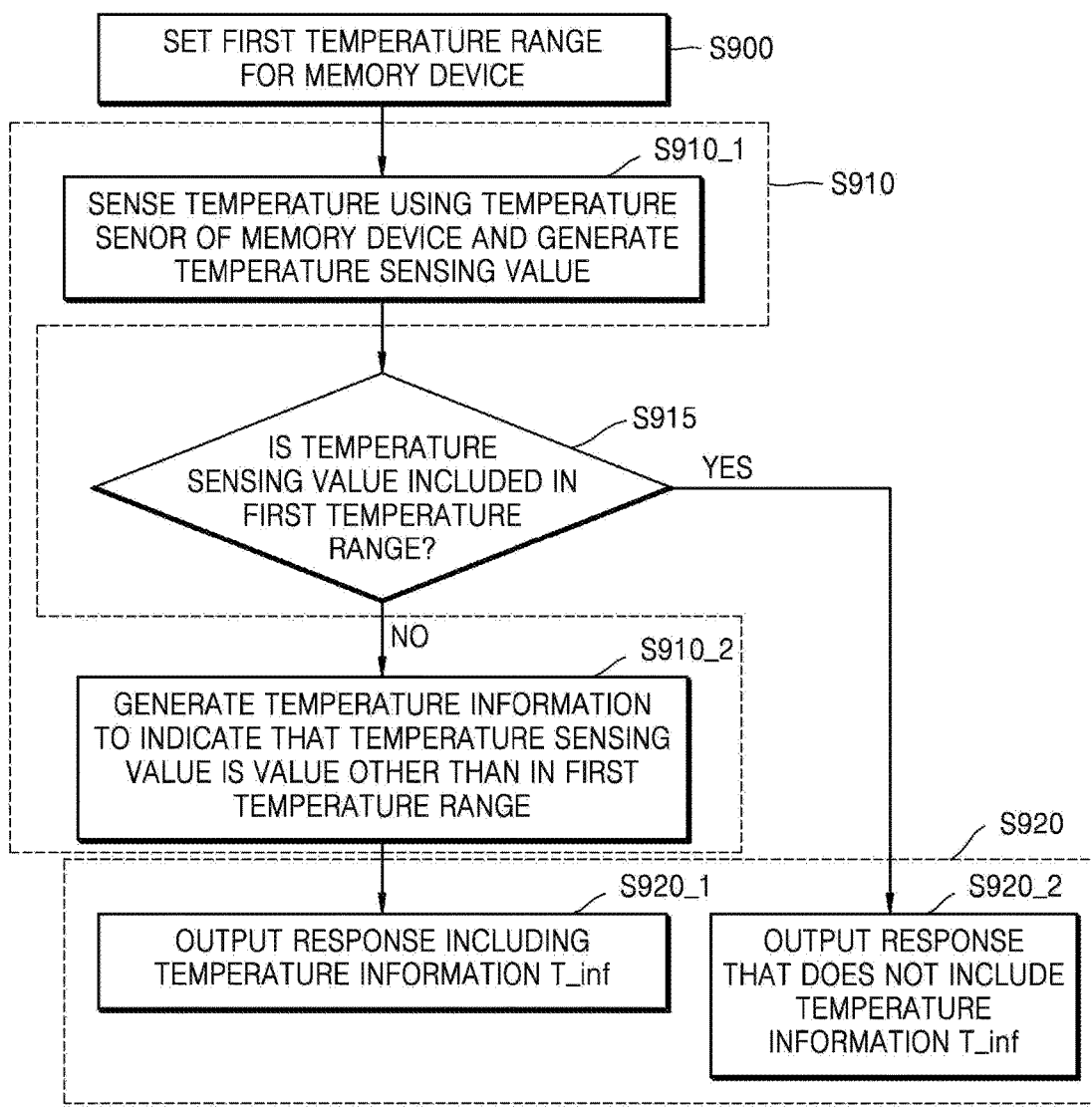
FIG. 9 is a flowchart illustrating a method of controlling a memory device according to an example embodiment of the inventive concepts.

FIG. 9 is a flowchart illustrating a method of controlling a memory device according to an example embodiment of the inventive concepts. The method of FIG. 9 may be performed by the memory system 200c of FIG. 8B. However, the inventive concepts are not limited thereto, and the method of FIG. 9 may be performed by another memory system according to an example embodiment of the inventive concepts. Referring to FIGS. 8 and 9, like the method of controlling the memory device as shown in FIG. 1, the method of controlling the memory device 220c as shown in FIG. 9 may include generating checked information (e.g., a temperature sensing value SVAL) of the memory device 220c as temperature information T_inf (S910), and outputting a response RSP1 in response to a command CMD1 input to the memory device 220c.

Also, like the method of controlling the memory device as shown in FIG. 1, the response RSP1 may be a response informing whether the memory device 220c is in a ready status in which the memory device 220c is capable of receiving an operation command and performing an operation.

The method of controlling the memory device as shown in FIG. 9 may further include setting a first temperature range for the memory device 220c (S900), and determining whether the checked temperature (e.g., the temperature sensing value SVAL) is included in the first temperature range (S915). When the temperature sensing value SVAL is not included in the first temperature range (refer to NO of S915), the operation S910 of generating the temperature sensing value SVAL as the temperature information T_inf may include generating the temperature information T_inf (S910_2). In the operation S910_2, the temperature information T_inf may be generated to indicate that the temperature sensing value SVAL is a value other than in the first temperature range. Also, a response RSP1 including the temperature information T_inf may be output (S920_1). However, when the temperature sensing value SVAL is included in the first temperature range (refer to YES of S915), a response RSP1 may not include temperature information T_inf but instead include only status information STA (see FIG. 18) of the memory device 200c and be transmitted to the memory controller 210 (S920_2). Namely, the read status indicates the temperature is in the first temperature range; and therefore, the read status serves as the temperature information. Therefore, according to the memory device, the memory system, and/or the method of controlling the memory device according to the present embodiment, unless a temperature of the memory device 220c is included in a specific temperature range (e.g., the first temperature range), temperature information T-inf may be transmitted to the memory controller 210, and when the control of a temperature variation is unnecessary, the temperature information may not be transmitted. Thus, efficient control of the memory device 220c may be performed.

As described above, temperature ranges may be set in various numbers. FIG. 10 is a diagram of temperature ranges according to an example embodiment of the inventive concepts. Referring to FIG. 10, a plurality of temperature ranges may be established, and indices may be given to the respective temperature ranges. For example, index 1 may be given to a temperature range lower than temperature A, and index 2 may be given to a temperature range equal to and higher than temperature A and lower than temperature B. The index information may be conveyed by a number of bits. For example, one bit may be used to indicated one of two temperature ranges, two bits may be used to convey one of four temperature ranges, etc.

Figure 11:
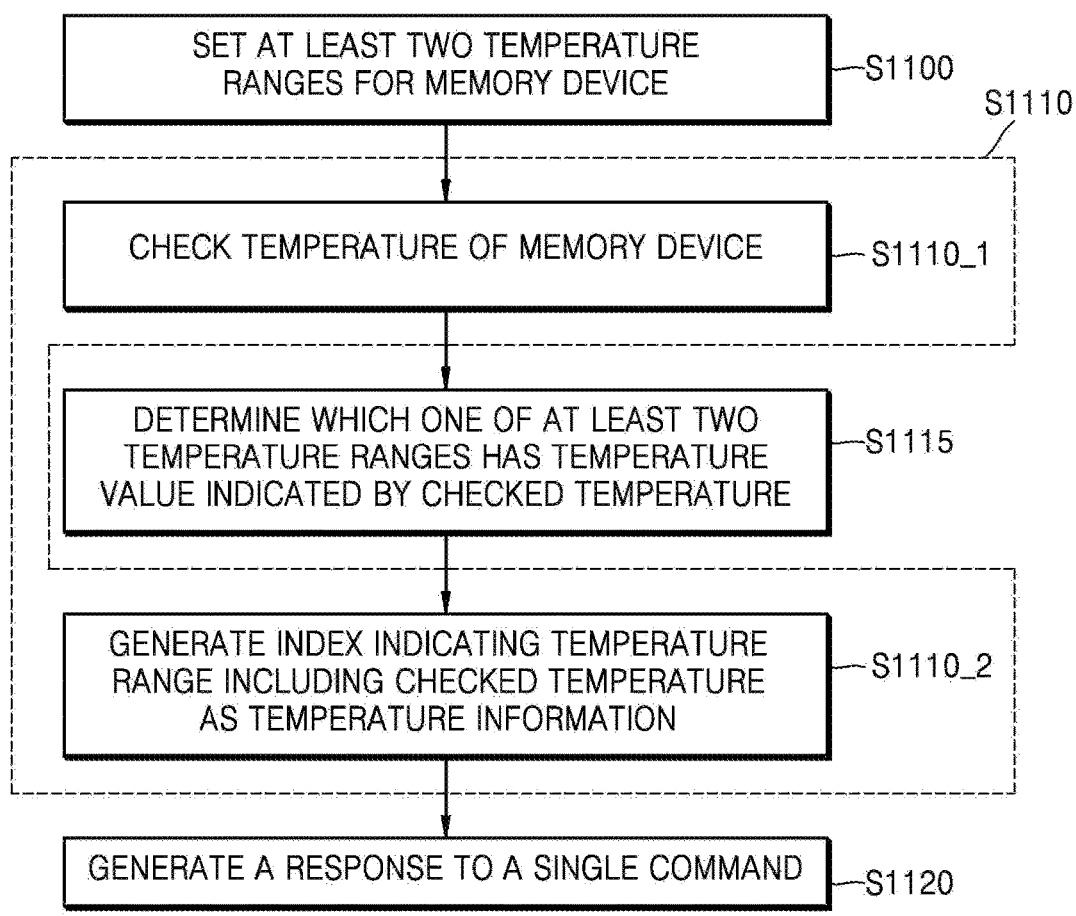
FIGS. 11 and 12 are flowcharts illustrating methods of controlling a memory device according to example embodiments of the inventive concepts.

FIG. 11 is a flowchart illustrating a method of controlling a memory device according to an example embodiment of the inventive concepts. The method of FIG. 11 may be performed by the memory system 200c of FIG. 8B. However, the inventive concepts are not limited thereto, and the method of FIG. 11 may be performed by another memory system or device according to an example embodiment of the inventive concepts. Referring to FIGS. 8B and 11, like the method the method of controlling the memory device as shown in FIG. 1, the method of controlling the memory device according to the present embodiment may include generating checked information (e.g., a temperature sensing value SVAL) of the memory device 220c as temperature information T_inf (S1110), and outputting a response RSP1 including the temperature information T_inf in response to a command CMD1 input to the memory device 220c (S1120). Also, like the method of controlling the memory device as shown in FIG. 1, the response RSP1 may be a response informing whether the memory device 220c is in a ready status in which the memory device 220c is capable of receiving an operation command and performing an operation.

The method of controlling the memory device as shown in FIG. 11 may further include setting at least two temperature ranges for the memory device 220c (S1100), and determining which one of the at least two temperature ranges has a temperature value indicated by the checked temperature (i.e., the temperature sensing value SVAL) (S1115). Also, the operation S1110 of generating the checked information (i.e., the temperature sensing value SVAL of the memory device 220c as the temperature information T_inf may include sensing or checking (sensing) a temperature of the memory device 220c (S1110_1), and generating an index indicating a temperature range including the checked temperature (i.e., the temperature sensing value SVAL) as the temperature information T_inf (S1110_2). In the example of FIG. 10, when a temperature sensing value SVAL is included in the temperature range equal to and higher than temperature A and lower than temperature B, index 2 may be generated as the temperature information T_inf. The temperature information control unit 224 may generate a second control signal XCON2 to generate an index as the temperature information T_inf.

Figure 12:
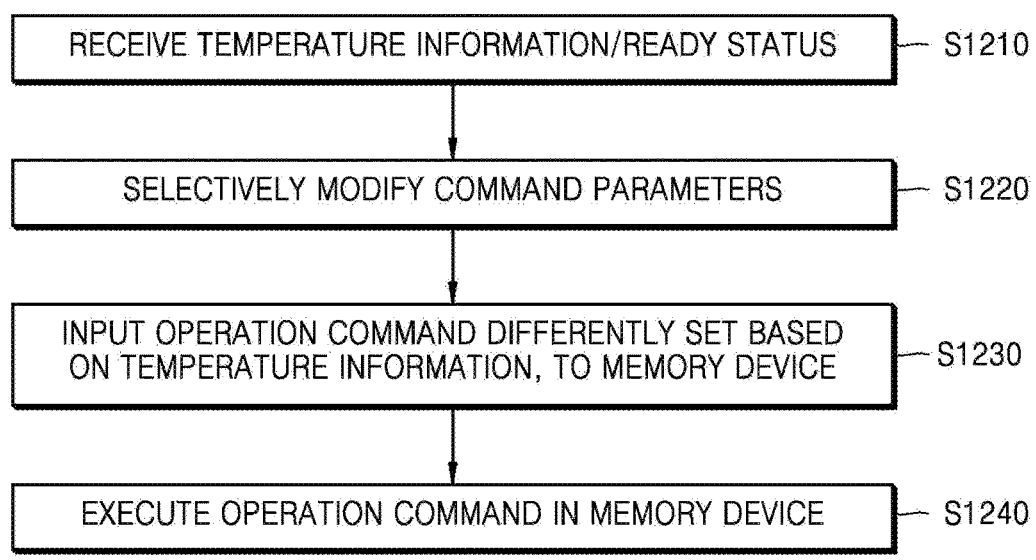

FIG. 12 is a flowchart illustrating a method of controlling a memory device according to an example embodiment of the inventive concepts. The method of FIG. 12 may be performed by the memory system 200 of FIG. 2. However, the inventive concepts are not limited thereto, and the method of FIG. 12 may be performed by another memory system according to an example embodiment of the inventive concepts. Referring to FIGS. 2 and 12, like the method of controlling the memory device as shown in FIG. 1, the method of controlling the memory device according to the present embodiment may include generating sensed or checked information (i.e., a temperature sensing value SVAL) of the memory device 220 as temperature information T_inf (S1210), and outputting a response RSP1 including the temperature information T_inf in response to a command CMD1 input to the memory device 220. However, as described above, a temperature range or index corresponding to the temperature sensing value SVAL may be generated as the temperature information T_inf. Furthermore, like the method of controlling the memory device as shown in FIG. 1, the response RSP1 may be a response informing whether the memory device 220 is in a ready status in which the memory device 220 is capable of receiving an operation command and performing an operation. This response and information is received by the memory controller 210 (S1210). In response, the memory controller 210 may modify memory control characteristics. For example, the memory control characteristics may include one or more of read voltages, incremental step pulse program voltages, erase voltages, program verify voltages, and duration to apply voltages to the memory device.

The method of controlling the memory device as shown in FIG. 12 may further include inputting an operation command, which has been differently set based on the temperature information T_inf, to the memory device 220 (S1230) and executing the operation command in the memory device 220 (S1240).

FIGS. 13 through 16C are diagrams illustrating methods of executing an operation command, which is differently set based on temperature information, in a memory device according to example embodiments of the inventive concepts. To begin with, referring to FIGS. 2, 12, and 13, the memory controller 210 may receive temperature information T_inf from the memory device 220 and differently set memory control characteristic values of an operation command.

Figure 13:
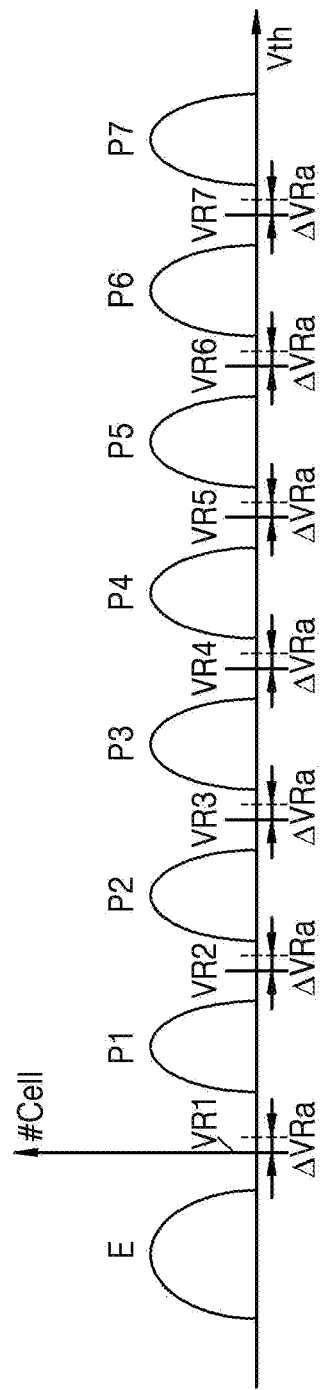

For example, the operation command may be a read command. In this case, a read voltage indicated by the read command may be changed from a first voltage level to a second voltage level and the read command may be input to the memory device 220 (S1230). For instance, when the memory device 220 is a triple-level-cell (TLC) NAND flash memory device, as shown in FIG. 13, each of memory cells of the memory device 220 may be programmed to have a threshold voltage included in one of eight distributions. For example, each of the memory cells of the memory device 220 may have one of an erase status E and seven program statuses P1 to P7.

In this case, seven read voltages VR1 to VR7 having different voltage levels may be set to read the memory cells. However, the distributions of threshold voltages of the memory cells programmed as shown in FIG. 13 may depend on a temperature variation of the memory device 220. According to the example embodiment of the inventive concepts, the memory controller 210 may increase a voltage level of each of the read voltages VR1 to VR7 by as much as VRa based on the temperature information T_inf included in the response RSP1. The memory device 220 may perform a read operation in response to a read command to instruct the read operation at a read voltage changed based on the temperature information T_inf (S1240).

Figure 14:
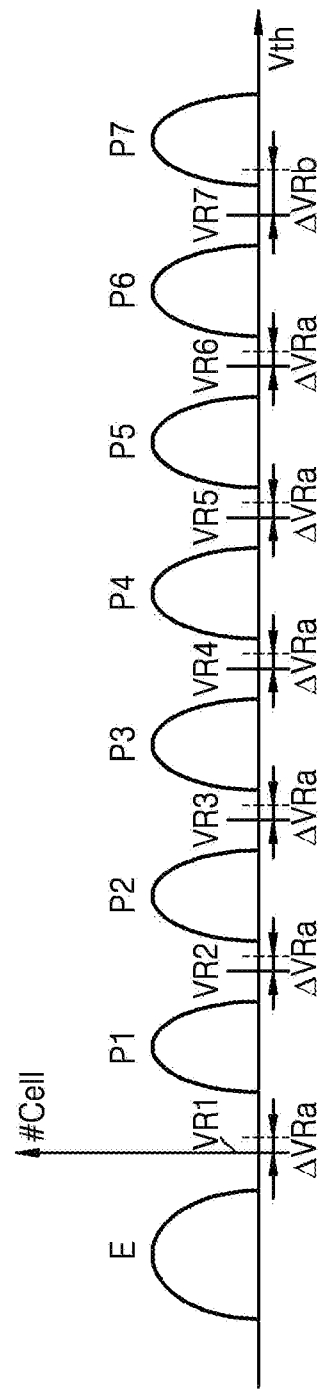

Although FIG. 13 illustrates an example in which each of all the read voltages VR1 to VR7 are increased by as much as VRa, the inventive concepts are not limited thereto. At least one read voltage may be changed unlike the other read voltages. For example, in FIG. 14, although each of the first through the sixth read voltages VR1-VR6 is increased by as much as VRa as in FIG. 13, a voltage level of the seventh read voltage VR7 for dividing the seventh program status P6 and the seventh program status P7 may be increased by as much as VRb. For example, when the sixth and seventh program statuses P6 and P7 vary within a large range with a temperature variation, voltage levels of the read voltages VR1 to VR7) may be controlled as shown in FIG. 14. Although FIGS. 13 and 14 illustrate an example in which the voltage levels of the read voltages VR1 to VR7 are increased with a temperature variation, the inventive concepts are not limited thereto, and the voltage levels of the read voltages VR1 to VR7 may be reduced with a temperature variation.

Figure 15:
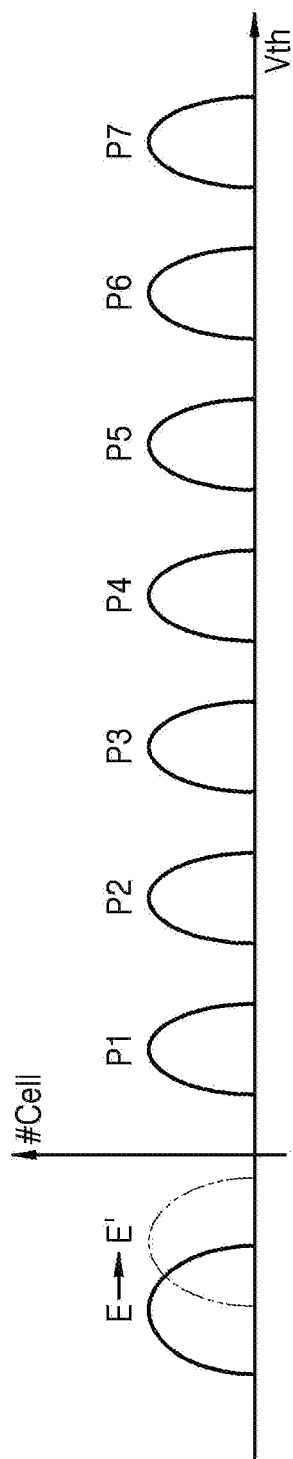

The operation command may be a command other than the read command. For example, the operation command may be an erase command. In this case, as shown in FIG. 15, the erase command may be input to the memory device 220 such that an erase status E is changed from a first voltage level to a second voltage level (S1230). The memory device 220 may change the erase status E into an erase state E' and perform an erase operation in response to the erase command (S1240).

In the example embodiment of the inventive concepts, when the memory device 220 is set to the erase status E' having a higher threshold voltage than the preset erase status E in a temperature range having a low error rate, memory cells may be erased in a soft erase status. In this case, time durations and power required for program operations in the program statuses P1 to P7 may be reduced. Alternatively, degradation of the memory cells may be mitigated or prevented.

Figure 16A:
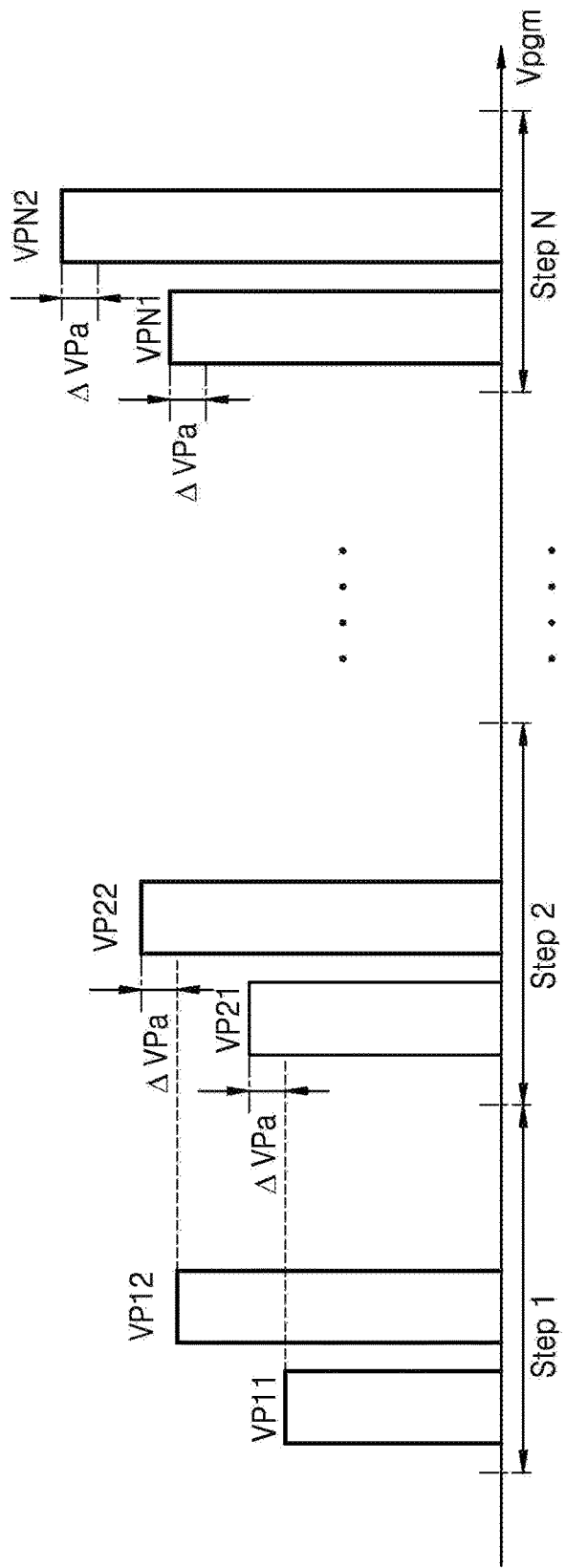

For example, the operation command may be a program command. As in FIG. 16A, the memory device 220 may perform a program operation using an incremental step pulse program (ISPP) scheme of performing a program including a plurality of steps (i.e., a plurality of loops) in response to the program command. FIG. 16A illustrates an example of an ISPP scheme in which one program loop includes N steps (N is an integer equal to or larger than 2), and each of the steps includes two program pulses.

For example, a first step may include a first program pulse VP11 and a second program pulse VP12, and a second step may include a first program pulse VP21 and a second program pulse VP22. In each of the steps, a program operation may be performed at a program pulse of which a voltage level is increased to be higher by VPa than a program pulse of the previous step. For example, a voltage level of the first program pulse VP21 of the second step may be set to higher by VPa than a voltage level of the first program pulse VP1 of the first step. Although not shown in FIG. 16A, each of the steps may further include a verification pulse for a verification operation. However, the verification operation may be omitted in an N-th step, which is a final step.

Figure 16B:
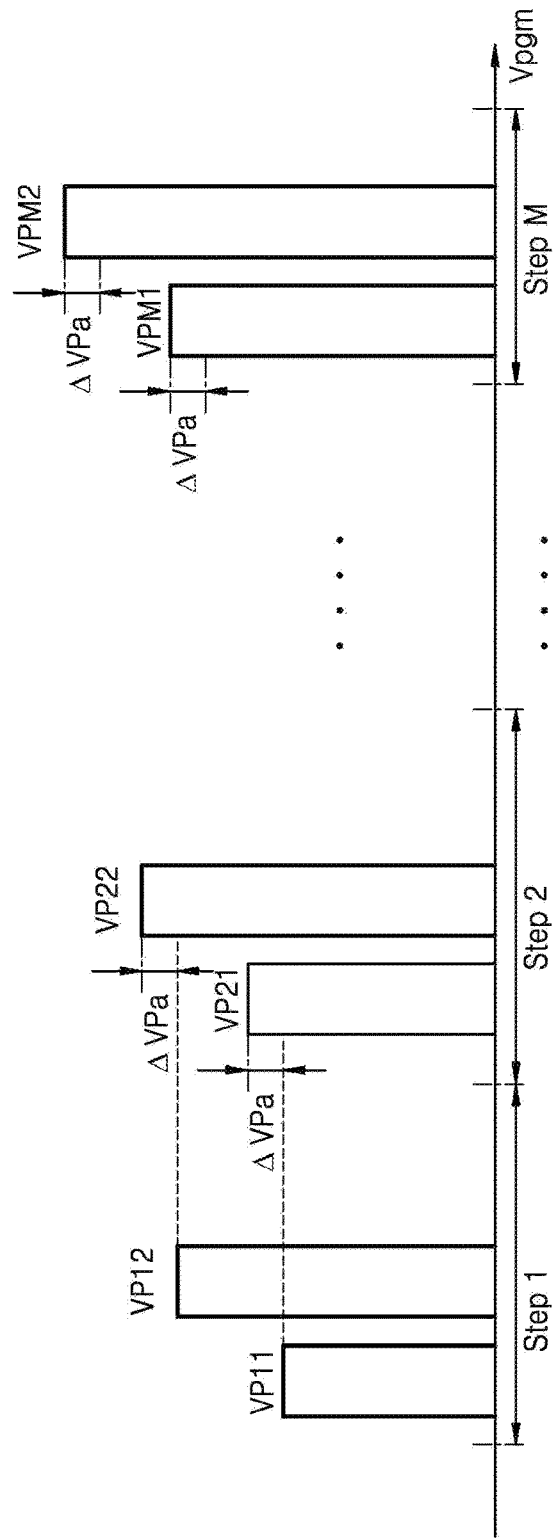

The memory controller 210 may differently set a program command to instruct the above-described program operation based on temperature information T_inf included in a response RSP1, and transmit the program command to the memory device 220 (S1230). For example, as shown in FIGS. 16B, the number of steps of the ISPP scheme may be increased or reduced from N to M (M is an integer equal to or larger than 2, M≠N). For example, when program errors in the memory device 220 increase with a temperature variation, the number of the steps of the ISPP scheme may be increased to M. However, even if a temperature variation occurs, when no program errors occur in the memory device 220, the number of the steps of the ISPP scheme may be reduced to reduce or prevent power consumption and save system resources.

Alternatively, as shown in FIG. 16C, a range in which a program pulse between the respective steps of the ISPP scheme is increased may be differently set according to a temperature variation. Referring to FIG. 16C, a voltage level of the first program pulse VP21 of the second step may be set to be higher by VPa1 than a voltage level of the first program pulse VP1 of the first step, while a voltage level of the second program pulse VP22 of the second step may be set to be higher by VPa2 than a voltage level of the second program pulse VP2 of the first step. Here, VPa2 is different from VPa1. Alternatively, differences in voltage level between program pulses of the first and second steps may be VPa1 and VPa2, while differences in voltage level between program pulses of N-1-th step and N-th step may be VPb1 and VPb2. The differences VPa1 and VPa2 may be different from the differences VPb1 and VPb2. For example, the magnitude of VPb1 and VPb2 may be decreased as temperature increases.

In addition, in the memory device, the memory system, and/or the method of controlling the memory device according to the present embodiment, the memory device 220 may be reset in response to a reset command, which is differently set based on temperature information T_inf of the memory device 220. For example, the reset command may include various setting values required to reset the memory device 220. The setting values may be differently set based on the temperature device T_inf and the applied to the memory device 220.

In the above described embodiments of FIGS. 12-16C, the change and amount of change in the memory control characteristic values may be empirically determined, for example, during the test phase of manufacture.

Figure 17:
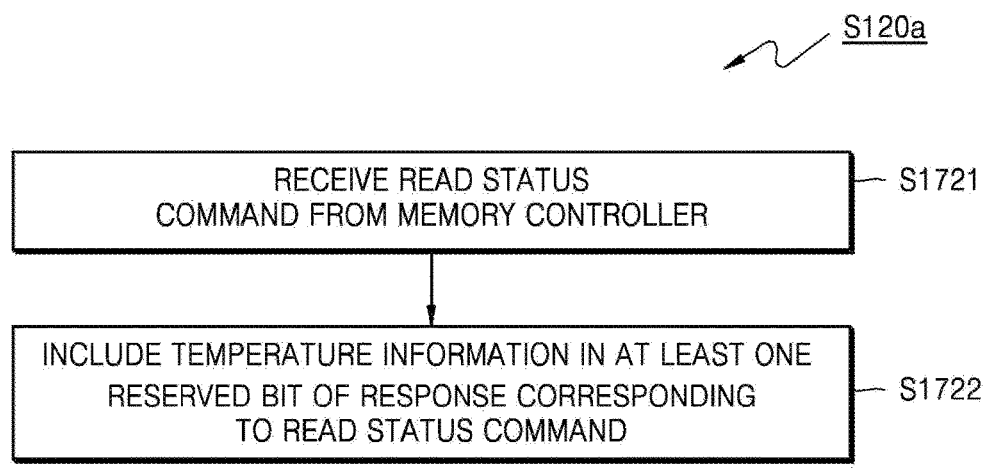
FIG. 17 is a flowchart illustrating a method of outputting a response including temperature information according to an example embodiment of the inventive concepts.

FIG. 17 is a flowchart illustrating a method of outputting a response including temperature information according to an example embodiment of the inventive concepts. Referring to FIGS. 2 and 17, a method S120a of outputting a response including temperature information T_inf may include receiving a first command CMD1 as a read status command from the memory controller 210 (S1721), and including the temperature information T_inf in at least one reserved bit of a response RSP1 corresponding to the read status command (S1722).

When the memory device 220 is the NAND flash memory device 220a of FIG. 3, particularly, a vertical NAND (VNAND) memory device in which memory cells are three-dimensionally formed, status information regarding the memory device 220 (e.g., the response RSP1 for the read status command CMD1) may be the same as in FIG. 18. The response RSP1 may be output through eight data I/O pins DQ0 to DQ7. Status information indicating whether the memory device 220 is in a busy status or a ready status may be output as the response RSP1 through the data I/O pins DQ5 and DQ6 of the eight data I/O pins DQ0 to DQ7. The data I/O pins DQ2 through DQ4 for the response RSP1 may be defined as reserved bits in response to all operation commands. Each bit of the response RSP1 corresponding to the read status command CMD1 may be differently defined in response to each operation command. For example, the data I/O pin DQ0 may indicate pass or failure in response to a block erase command, while the data I/O pin DQ0 may be defined as an unused bit (i.e., a reserved bit) in response to a read command.

For example, eight temperature ranges may be set, and all three reserved bits may be used to include temperature information. Alternatively, three temperature ranges may be set, and two of the three reserved bits may be used. Alternatively, three temperature ranges may be set, and one of the three reserved bits may be used. In this case, for example, temperature ranges may be divided into a range lower than temperature A, a range equal to and higher than temperature A and lower than temperature B, and a range equal to and higher than temperature B. In the range equal to and higher than temperature A and lower than temperature B, a value of one reserved bit may be set to 0. In the remaining two ranges, a value of one reserved bit may be set to 1. When the memory controller 210, which has received the response RSP1 of which reserved bit has a value of 1, requests to confirm whether the temperature range is a range lower than temperature A or a range equal to or higher than temperature B, the reserved bit may be set to a different value, and a range into which the temperature falls may be informed.

Temperature information T_inf may be included in the reserved bit of the response RSP1, and the response RSP1 may be output from the memory device 220. However, as described above, the response RSP1 may not include the temperature information T_inf. In this case, the response RSP1 may include only status information regarding the memory device 220, for example, only status information indicating that the memory device 220 is in a ready status in which the memory device 220 is capable of performing an additional operation command.

Figure 19:
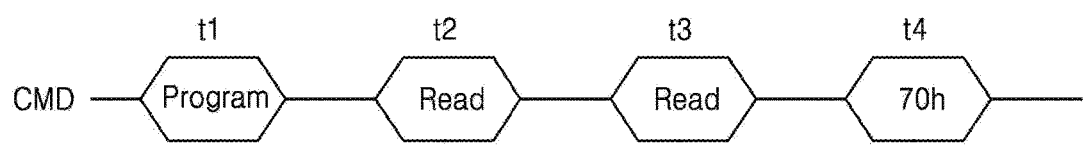
FIG. 19 is a diagram of a response according to an example embodiment of the inventive concepts.

FIG. 19 is a diagram of a response according to an example embodiment of the inventive concepts. Referring to FIGS. 2 and 19, a program command, a read command, and another read command may be sequentially applied from the memory controller 210 at time points t1, t2, and t3, respectively. Next, when a read status command 70h is applied from the memory controller 210 to the memory device 220 at a time point t4, the memory device 200 may report a status of the processing of the finally applied command (e.g., the read command applied at the time point t3) as a response RSP1 to the read status command 70h. For example, the response RSP1 may set the data I/O pins DQ5 and DQ6 to 1 and inform that the memory device 220 is in a ready status in which the read command applied at the time point t3 has been processed and another operation command may be processed.

However, as described above, temperature information T_inf regarding the memory device 220 may be generated when a final program command is executed. Accordingly, the response RSP1 for the read status command 70h may be generated by including temperature information T_inf regarding the memory device 220, which is obtained during the execution of the program command applied at the time point t1, in a reserved bit. Thus, according to the present embodiment, the response RSP1 to the read status command 70h may include not only information regarding a present status of the memory device 220 but also information regarding the previous status thereof. More specifically, the memory device 220 may be configured or programmed to generate temperature information associated with a most recent command of a particular type (e.g., a program command in the above example).

Therefore, according to the memory device, memory system, and/or method of controlling the memory device according to the present embodiment, temperature information regarding the memory device may be transmitted to the memory controller using a sequence for a preset read status command instead of an additional sequence for sensing a temperature, thereby reducing overhead of the memory device or the memory system. Namely, a predefined sequence of commands and handshakes between the memory device 220 and the memory controller 210 is not required. Instead, a single command may trigger the output of the temperature information.

Figure 20:
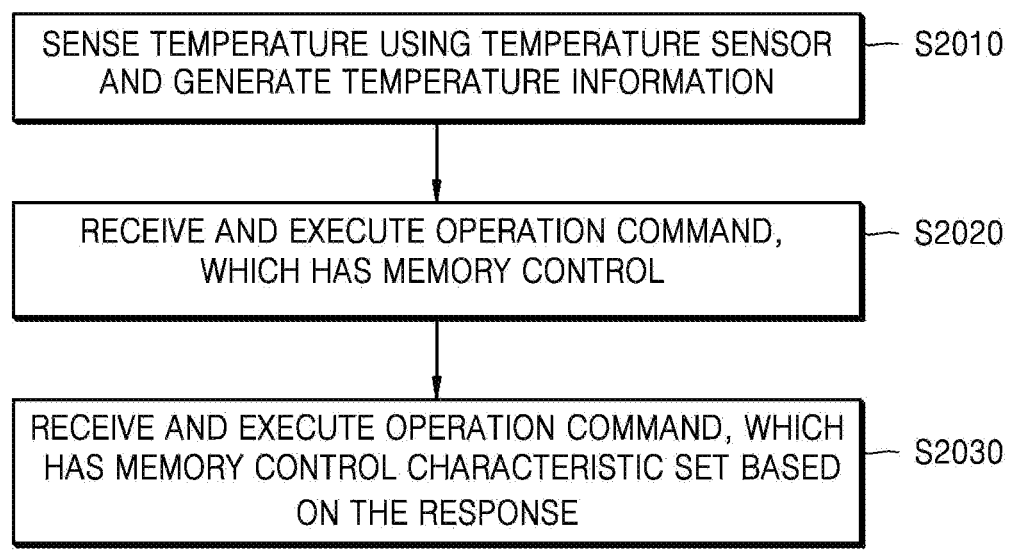
FIG. 20 is a flowchart illustrating a method of operating a memory device according to an example embodiment of the inventive concepts.
Figure 21:
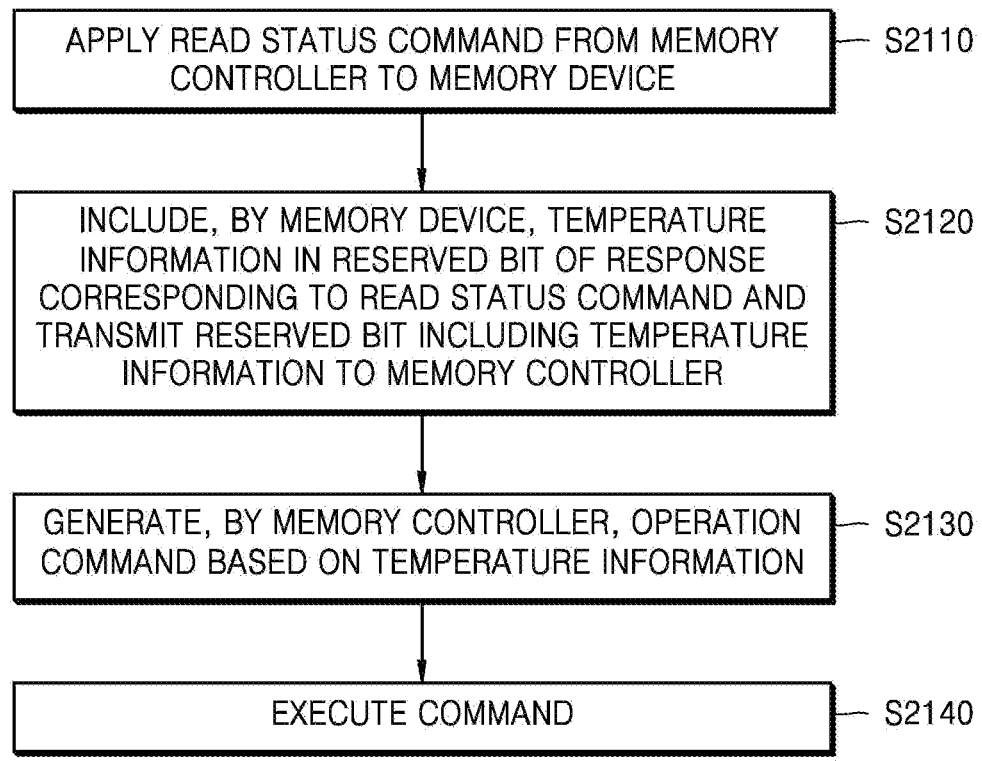
FIG. 21 is a flowchart illustrating a method of operating a memory system according to an example embodiment of the inventive concepts.

When a processing sequence for an operation command preset in the normal mode is used to sense a temperature of the memory device 220 instead of an additional sequence, a system overhead may be reduced as described above FIG. 20 is a flowchart illustrating a method of operating a memory device according to an example embodiment of the inventive concepts, and FIG. 21 is a flowchart illustrating a method of operating a memory system according to an example embodiment of the inventive concepts. To begin with, referring to FIGS. 2 and 20, a method of operating the memory device 220 may include sensing a temperature using a temperature sensor and generating temperature information T_inf (S2010). The temperature information T_inf may be provided as one or more reserved bit(s) of a response to an input read status command CMD1. The memory device 220 outputs the response with the reserved bit(s) (S2020). The memory device 220 executes an operation command, which has memory control characteristics set based on the temperature information T_inf (S2030). The operation S2010 of generating the temperature information T_inf may be the same as described in the operation S110 of FIG. 1, and the operation S2020 of including the temperature information T_inf in the reserved bit and outputting the reserved bit including the temperature information T_inf in response to the input read status command CMD1 may be the same as described in the operation S120 of FIG. 1. Also, the operation S2030 of executing the operation command differently set and input based on the temperature information T_inf may be the same as described with reference to FIGS. 13 through 16C.

Referring to FIGS. 2 and 21, a method of operating a memory system 200 may include applying a read status command CMD1 from the memory controller 210 to the memory device 220 (S2110), including, by the memory device 220, temperature information T_inf in a reserved bit of a response corresponding to the read status command CMD1 input from the memory controller 210 and outputting the reserved bit including the temperature information T_inf (S2120), generating, by the memory controller 210, an operation command based on the temperature information T_inf (S2130), and executing the operation command, which has memory control characteristics set based on the temperature information T_inf (S2140). In addition, the memory controller 210 may control temperature types described with reference to FIGS. 5 through 7 or temperature ranges described with reference to FIG. 8. Since the methods of FIGS. 20 and 21 are described above with reference to the methods of controlling the memory device according to the previous embodiments, further detailed descriptions thereof are omitted.

Figure 22A:
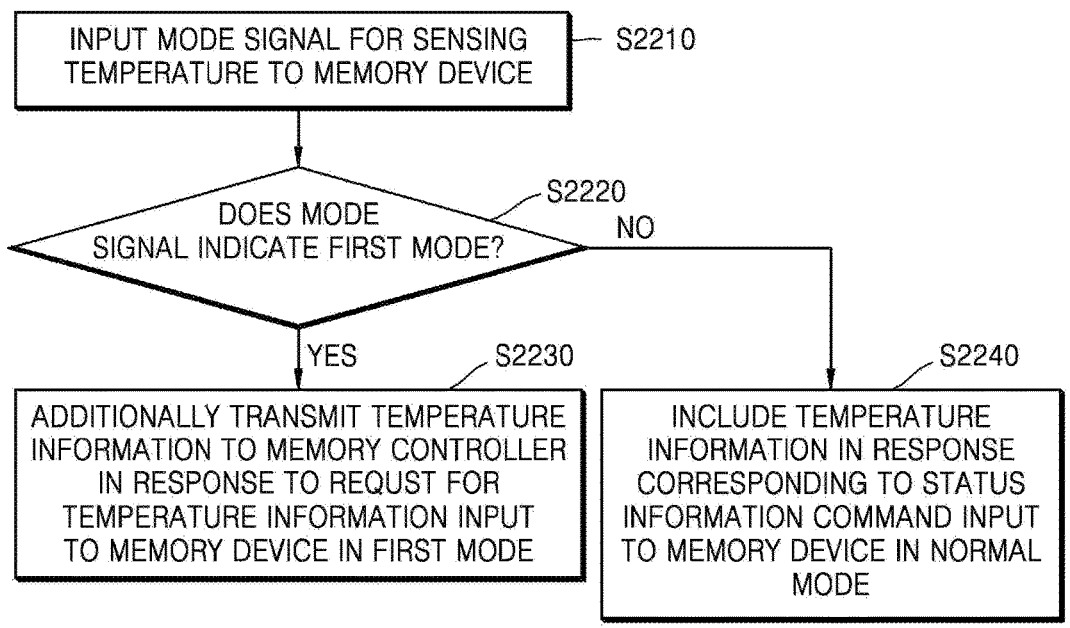
FIG. 22A is a flowchart illustrating a method of controlling a memory device according to an example embodiment of the inventive concepts.

FIG. 22A is a flowchart illustrating a method of controlling a memory device according to an example embodiment of the inventive concepts. Referring to FIG. 22A, the method of controlling the memory device according to the present embodiment may include inputting a mode signal for sensing a temperature to the memory device 220 (S2210), determining whether the mode signal indicates a first mode for performing a set feature on the memory device 220 (S2220), requesting, by the memory controller 210, temperature information T_inf from the memory device 220 in the first mode and additionally transmitting, by the memory device 220, the temperature information T_inf to the memory controller 210 at the request of the memory controller 210 when the mode signal indicates the first mode (refer to YES of S2220) (S2230), and including the temperature information T_inf in a reserved bit of a response corresponding to a read status command input from the memory controller 210 to the memory device 220 and outputting the reserved bit including the temperature information T_inf when the mode signal does not indicate the first mode (refer to NO of S2220) (e.g., when the mode signal indicates a normal mode for performing read and program operations) (S2240). When the temperature information T_inf is requested in the first mode, the memory device 220 may sense the temperature information T_inf, and the memory controller 210 may be in a waiting status during the sensing of the temperature information T_inf. The temperature information T_inf in the first mode may not be included in other information but additionally transmitted to the memory controller 210. A multi-command sequence is required in the first mode to obtain the temperature information. By contrast, when not in the first mode, a single command may result in output of the temperature information. When a processing sequence for an operation command preset in the normal mode is used to sense a temperature of the memory device 220 instead of an additional sequence, a system overhead may be reduced as described above. However, the temperature information T_inf may be sensed in an additional mode (e.g., first mode) when necessary.

Figure 22B:
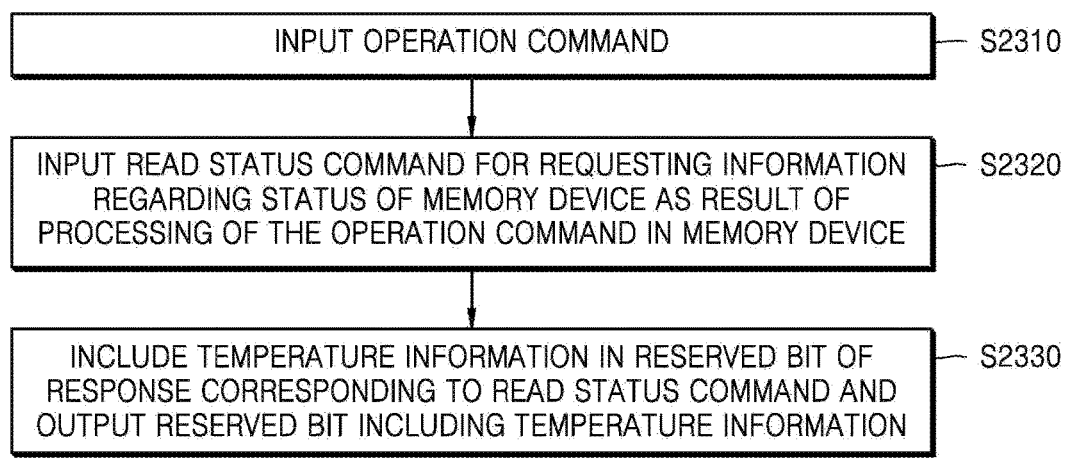
FIG. 22B is a flowchart illustrating an operation of outputting temperature information in response to a temperature sensing command input by a memory controller.

FIG. 22B is a flowchart illustrating a method of controlling a memory device according to another example embodiment of the inventive concepts. Referring to FIG. 22B, the method of controlling the memory device according to the present embodiment may include inputting an operation command to a memory device (S2310), inputting a read status command for requesting information regarding a status of the memory device affected by the processing of the operation command in the memory device (S2320), and including, the memory device, temperature information in a reserved bit of a response corresponding to the read status command and outputting the reserved bit including the temperature information (S2330). The operation command may be a program command, a read command, or an erase command. As in the above-described example of FIG. 19, the read status command may be applied to the memory device to request to confirm whether the read command applied at the time point t3 has been processed and the memory device enters into a ready status. Thus, the memory device may include the temperature information in the reserved bit of the response corresponding to the read status command and output the reserved bit.

The above-described memory device may be a VNAND flash memory device as described below. An example of a memory cell array of the VNAND flash memory device will be described below with reference to FIGS. 23 through 26. The memory cell array of the VNAND flash memory device may include a plurality of memory blocks, and any one memory block (e.g., a first memory block BLK1) is illustrated in FIG. 23.

Figure 23:
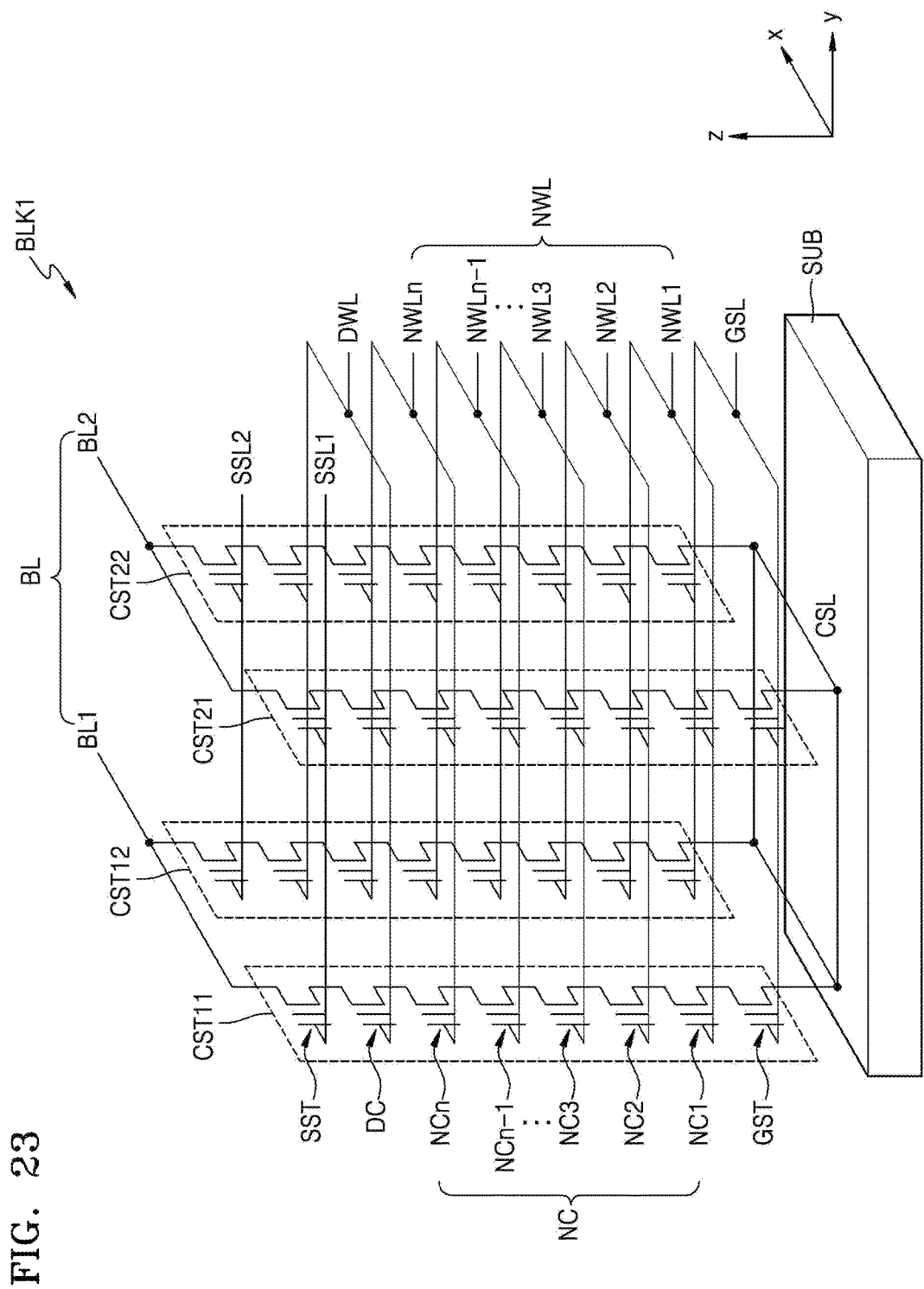
FIGS. 23 through 26 are diagrams of a memory cell array of a VNAND flash memory device according to an example embodiment of the inventive concepts.

Referring to FIG. 23, the first memory block BLK1 may include a substrate SUB, a plurality of cell strings CST, a dummy word line DWL, a normal word line NWL, a bit line BL, a ground selection line GSL, and a common source line CSL. In the following description, cell strings CST, word lines WL, and bit lines BL included in the first memory block BLK1 are provided in specific numbers for brevity. However, the inventive concepts is not limited thereto, and the cell strings CST, the word lines WL, and the bit lines BL included in the first memory block BLK1 may be provided in various numbers. In addition, the number of normal cells included in the cell string CST will also be described below as an example.

The cell string CST may be connected between the bit line BL and the common source line CSL. As described above, the cell string CST may extend in a vertical direction Z from the substrate SUB. The cell string CST may include a string selection transistor SST, a dummy cell DC, a plurality of normal cells NC, and a ground selection transistor GST, which may be connected in series between the bit line BL and the common source line CSL. For example, a cell string CST11 may include the string selection transistor SST, the dummy cell DC, the normal cells NC1 to NCn, and the ground selection transistor GST, which may be connected in series between a bit line BL1 and the common source line CSL.

The string selection transistor SST may be connected to the string selection line SSL, which extends in a column direction Y, and controlled. The ground selection transistor GST may be connected to the ground selection line GSL, which may extend in a row direction X and the column direction Y, and be controlled. For example, the string selection transistor SST of the cell string CST11 may be connected to a string selection line SSL1 and connected, and a string selection transistor SST of a cell string CST12 may be connected to a string selection line SSL2 and controlled. Also, ground selection transistors GST of cell strings CST11, CST12, CST21, and CST22 may be connected in common to the shared ground selection line GSL and controlled.

The dummy cell DC may be connected to a dummy word line DWL, which may extend in the row direction X and the column direction Y, and be controlled. Each of the normal cells NC may be connected to the normal word line NWL, which may extend in the row direction X and the column direction Y, and be controlled. For example, dummy cells DC of the cell strings CST11, CST12, CST21, and CST22 may be connected in common to the shared dummy word line DWL and controlled. The dummy cells DC may be provided to improve operating characteristics of each of the cell strings CST. For example, the dummy cells DC may be used to reduce the influence of degradation of the string selection transistor SST of each of the cell strings CST upon the cell string CSL or prevent degradation of the cell strings CST due to a difference between voltages applied to the string selection transistor SST and the normal cell NC during operations of the normal cells NC of the cell strings CST.

Data may be written in the normal cells NC1 to NCn. The normal cells NC1 to NCn of the cell strings CST11, CST12, CST21, and CST22 may be connected in common to the shared normal word line NWL and controlled.

The bit line BL may be connected to a plurality of cell strings CST arranged in the row direction X. For example, the cell string CST11 and the cell string CST12 may be connected to the bit line BL1, and the cell string CST21 and the cell string CST22 may be connected to a bit line BL2. As described above, the memory cell array may include a larger number of bit lines BL and a larger number of cell strings CST than shown in FIG. 2.

Figure 24:
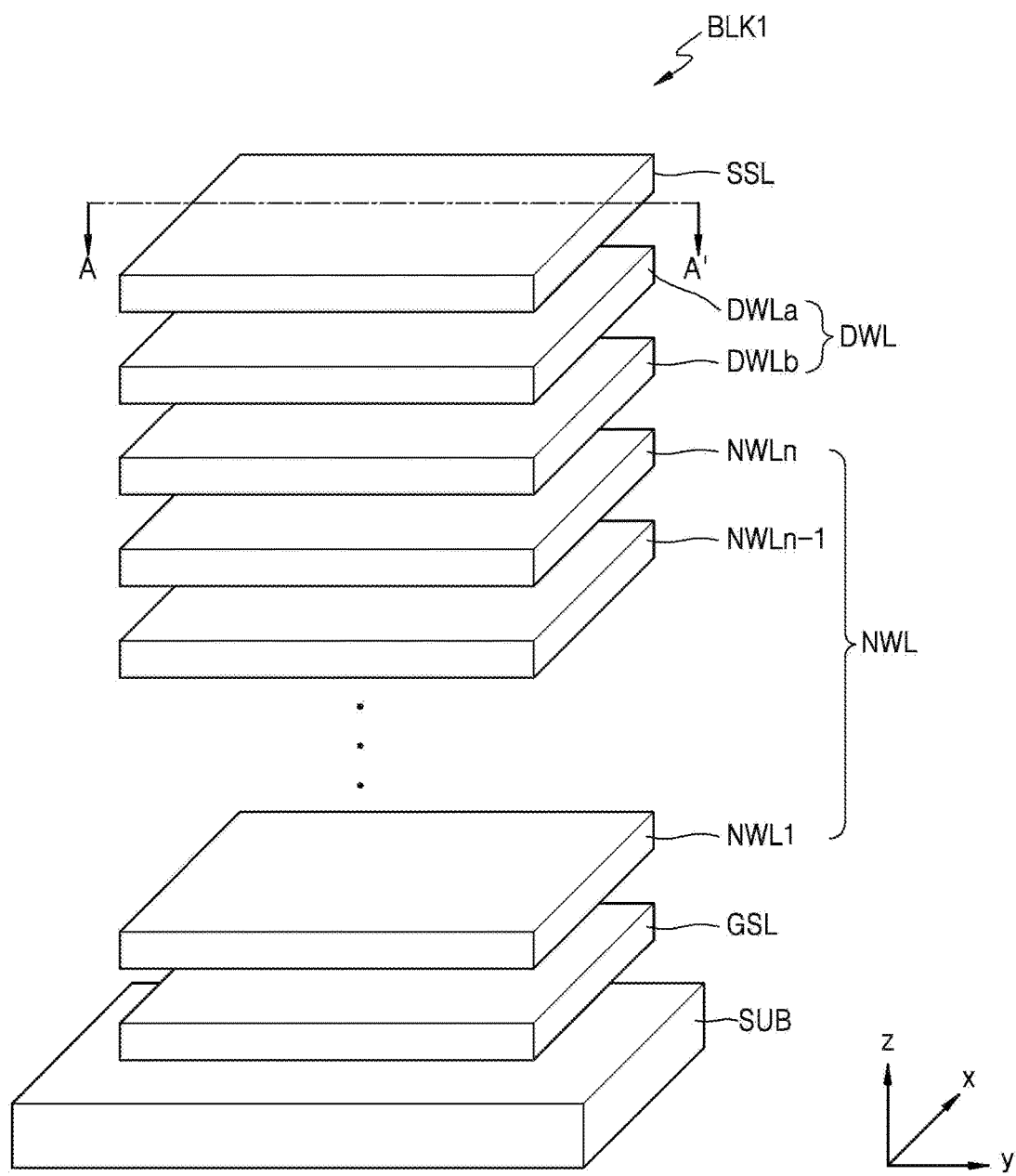
Figure 25:
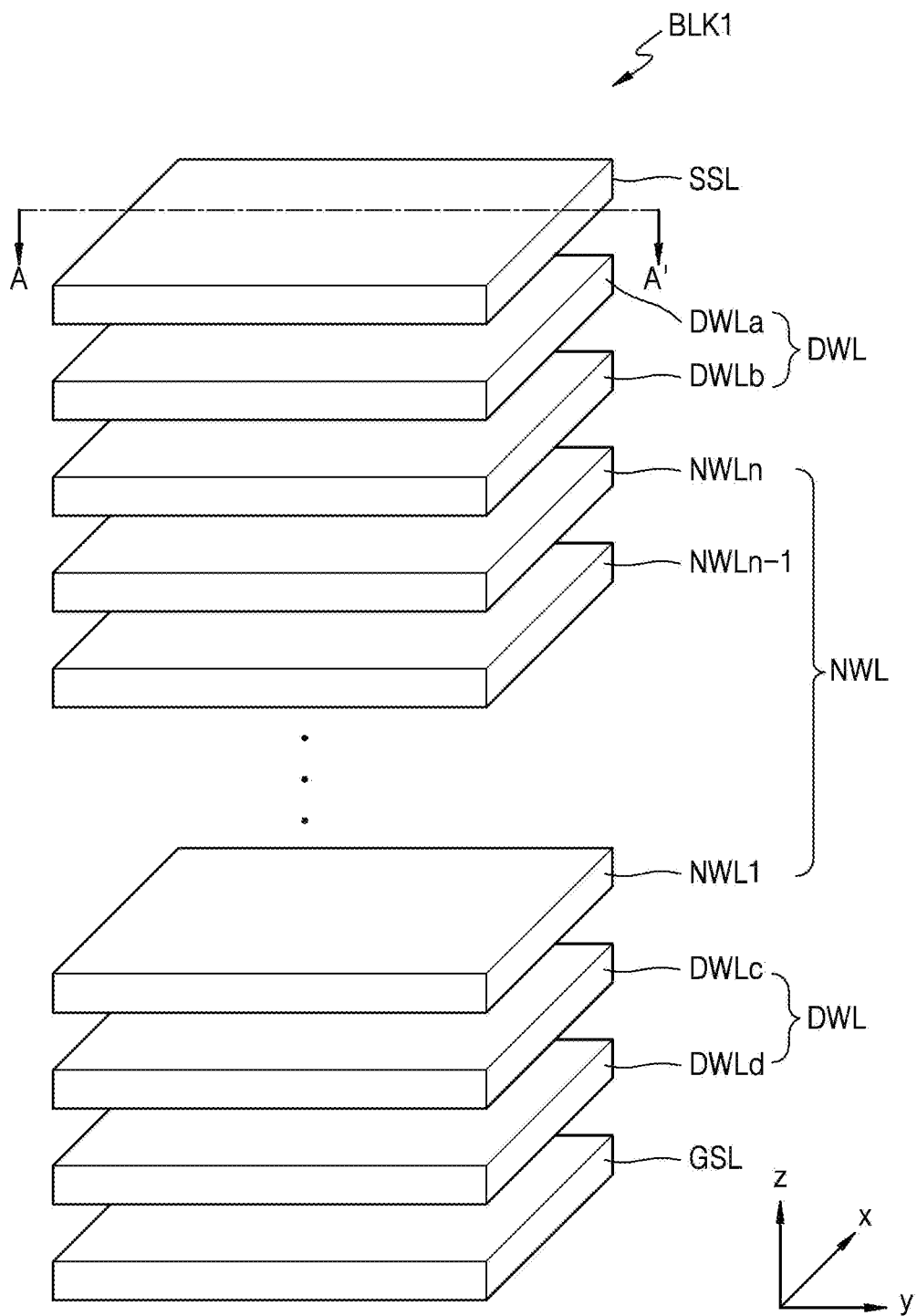

Although FIG. 23 illustrates an example in which each of the cell strings CST includes only one dummy cell DC, the inventive concepts is not limited thereto. Referring to FIG. 24, which shows another example of the first memory block BLK1, layers stacked in the vertical direction Z from the substrate SUB are respectively illustrated as a string selection line SSL, a dummy word line DWL, a normal word line NWL, and a ground selection line GSL, which may be respectively connected to the string selection transistor SST, the dummy cell DC, the normal cells NC, and the ground selection transistor GST of each of the cell strings CST. For brevity, the corresponding transistor or cell is not illustrated in each of the layers.

As shown in FIG. 24, the dummy word line DWL may be embodied by two layers DWLa and DWLb disposed adjacent to the string selection line SSL. Furthermore, referring to FIG. 25, which shows another example of the first memory block BLK1, the dummy word line DWL may be embodied by two layers DWLa and DWLb disposed adjacent to the string selection line SSL, and two layers DWLc and DWLd disposed adjacent to the ground selection line GSL. However, the inventive concepts is not limited thereto, and the dummy word line DWL may include one layer disposed adjacent to the string selection line SSL and one layer disposed adjacent to the ground selection line GSL. A layer indicated by the dummy cell DC or the dummy word line DWL may be provided to reduce or minimize undesired influence of a voltage, which is applied to the string selection line SSL, the dummy word line DWL, the normal word line NWL, and the ground selection line GSL, upon the cell strings CST during operations of the memory device 220.

Figure 26:
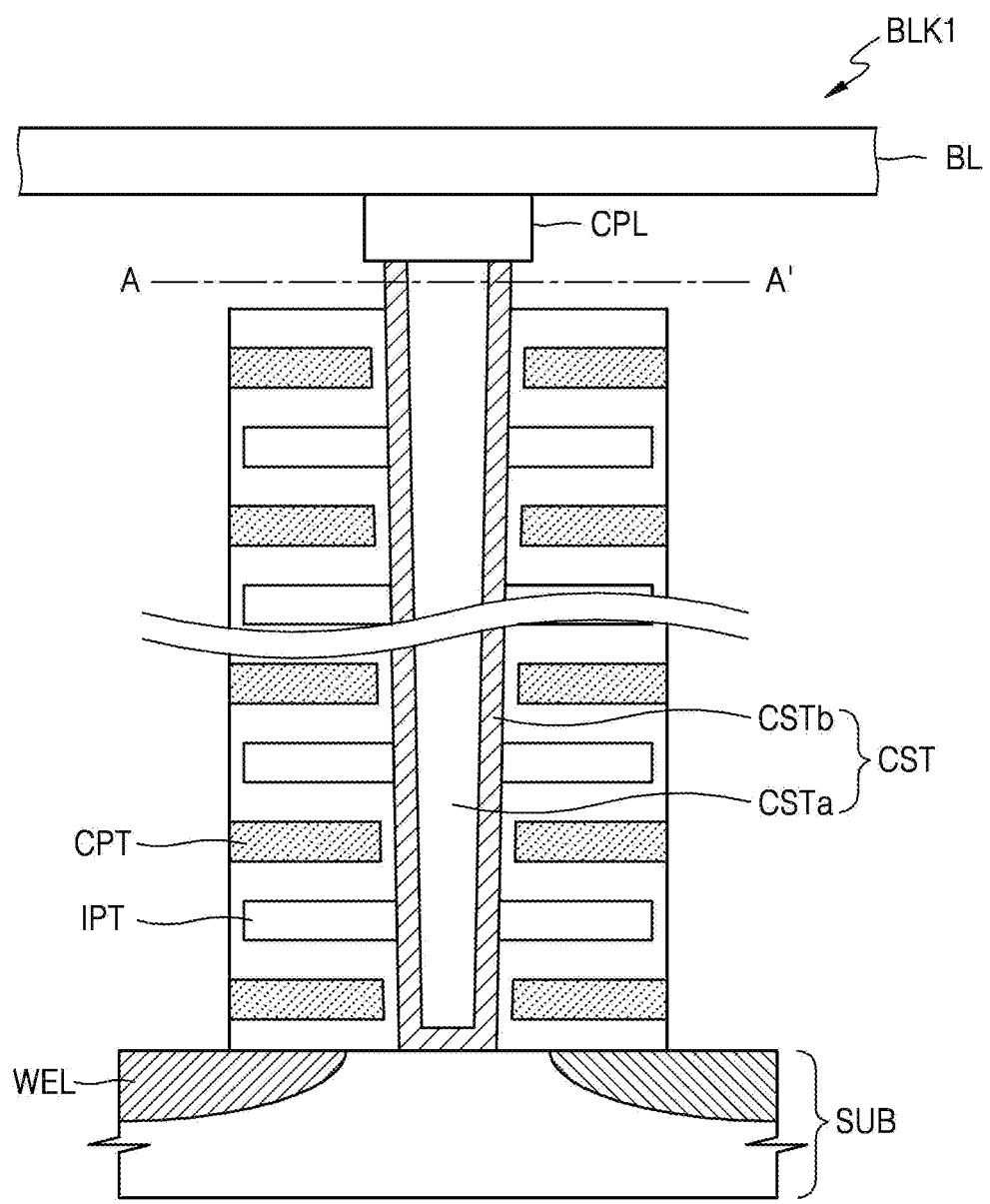

FIG. 26 is a cross-sectional view of the memory cell array of FIG. 24, which is taken along line A-A' of FIG. 24. Referring to FIG. 26, a well WEL of a second conductivity type, which is different from a first conductivity type, may be formed on a substrate SUB of the first conductivity type. The first conductivity type may be a p type, and the second conductivity type may be an n type. However, the inventive concepts is not limited thereto. An insulating pattern IPT and a conductive pattern CPT may be alternately stacked on a pair of wells WEL disposed adjacent to each other. The insulating pattern IPT may be formed of silicon oxide, and the conductive pattern CPT may be formed of polysilicon (poly-Si). The insulating pattern IPT and the conductive pattern CPT may be formed using a chemical vapor deposition (CVD) process. Gates of the above-described string selection transistor SST, dummy cell DC, normal cells NC, and ground selection transistor GST may be embodied by the conductive patterns CPT.

A channel structure CST configured to connect the substrate SUB, a contact plug CPL, and a drain may be formed between two stack structures obtained by alternately stacking the insulating pattern IPT and the conductive pattern CPT. The channel structure CST may include a pillar CSTa and a channel region CSTb. The pillar CSTa of the channel structure CST may be formed of an insulating material.

Therefore, the string selection transistor SST, the dummy cell DC, the normal cells NC, and the ground selection transistor GST included in the cell string CST may share the same channel. As shown in FIG. 26, the channel structure CST may extend in the direction Z vertical to the substrate SUB. The channel structure CST may have channel-last structure (e.g., a bit-cost scalable (BiCS) structure) in which the channel structure CST is formed after the conductive pattern CPT is formed, or a channel-first structure (e.g., a terabit cell array transistor (TCAT) structure) in which the conductive pattern CPT is formed after the channel structure CST is formed.

In the VNAND flash memory device having the above-described structure, each of memory cells may have a charge-trap-flash (CTF) structure in which charges are stored in a three-dimensional cylindrical thin nonconductor layer. Here, three-dimensional CTF cells may be particularly sensitive to a temperature variation. In the memory device, the memory system, and the method of controlling the memory device according to the present embodiment, a temperature variation of the memory device may be efficiently sensed and optimally controlled.

Figure 27:
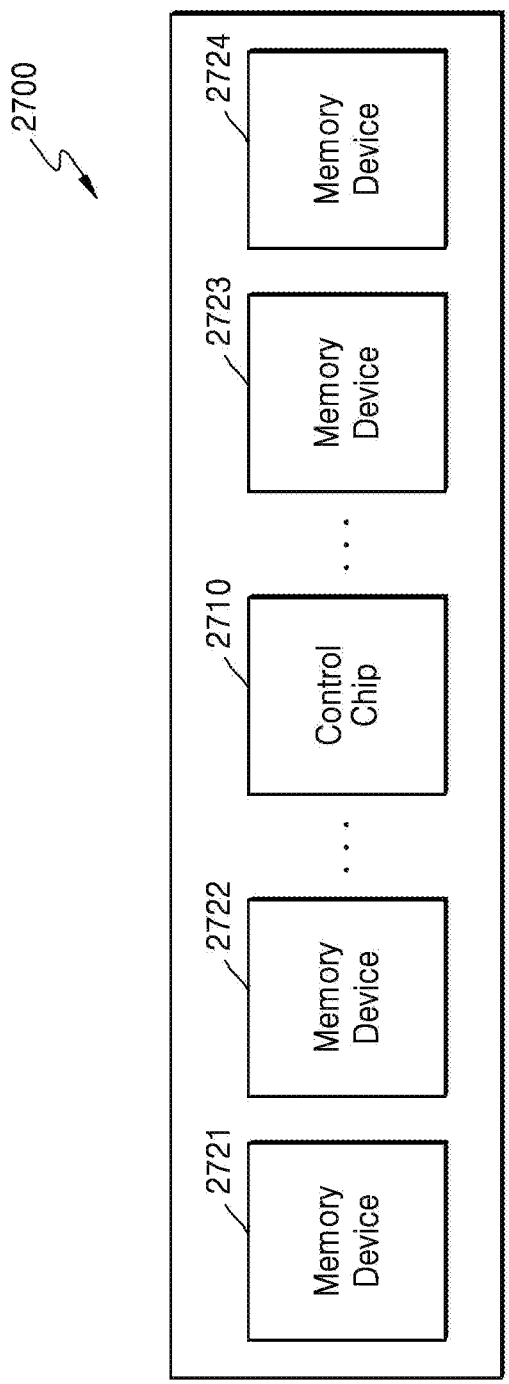
FIG. 27 is a diagram a memory module according to an example embodiment of the inventive concepts.

FIG. 27 is a diagram a memory module 2700 according to an example embodiment of the inventive concepts. Referring to FIG. 27, the memory module 2700 may include memory chips 2721 to 2724 and a control chip 2710. The memory chips 2721 to 2724 may store data. The control chip 2710 may control the memory chips 2721 to 2724 in response to various signals transmitted from an external memory controller. For example, the control chip 2710 may enable one of the memory chips 2721 to 2724 corresponding to an externally transmitted chip selection signal, and perform error check and correction operations on data read from each of the memory chips 2721 to 2724. For example, each of the memory chips 2721 to 2724 may be the memory device 220 of FIG. 2. Accordingly, the memory module 2700 according to the present embodiment may receive temperatures from the memory chips 2721 to 2724 and transmit the temperatures to the control chip 2710 using an optimized method for an operation status of the memory module 2700 without causing an overhead. The control chip 2710 may receive temperature information from the memory chips 2721 to 2724 and transmit the temperature information to the external memory controller.

Figure 28:
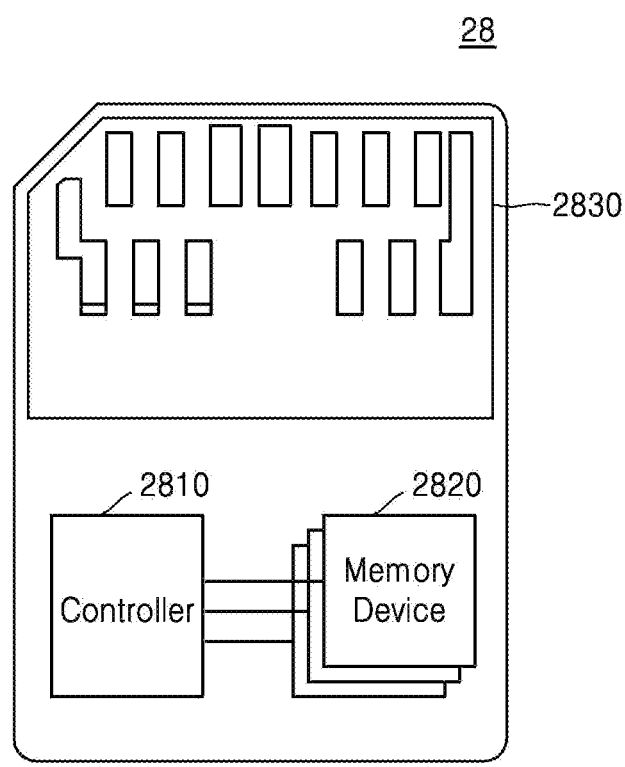
FIG. 28 is a diagram a memory card according to an example embodiment of the inventive concepts.

FIG. 28 is a diagram a memory card 2800 according to an example embodiment of the inventive concepts. The memory card 2800 may be a portable storage device, which may be connected to an electronic device, such as a mobile device or a desk-top computer, and used. As shown in FIG. 28, the memory card 2800 may include a memory controller 2810, a memory device 2820, and a port region 2830. The memory card 2800 may communicate with an external host (not shown) via the port region 2830, and the memory controller 2810 may control the memory device 2820. The memory controller 2810 may read a program from a read-only memory (ROM) (not shown) configured to store the program. According to the present embodiment, the memory controller 2810 may provide various pieces of information for controlling voltage levels and/or voltage rising time points to the memory device 2820, and the memory device 2820 may control rising time points of voltages provided to word lines based on the received information.

Figure 29:
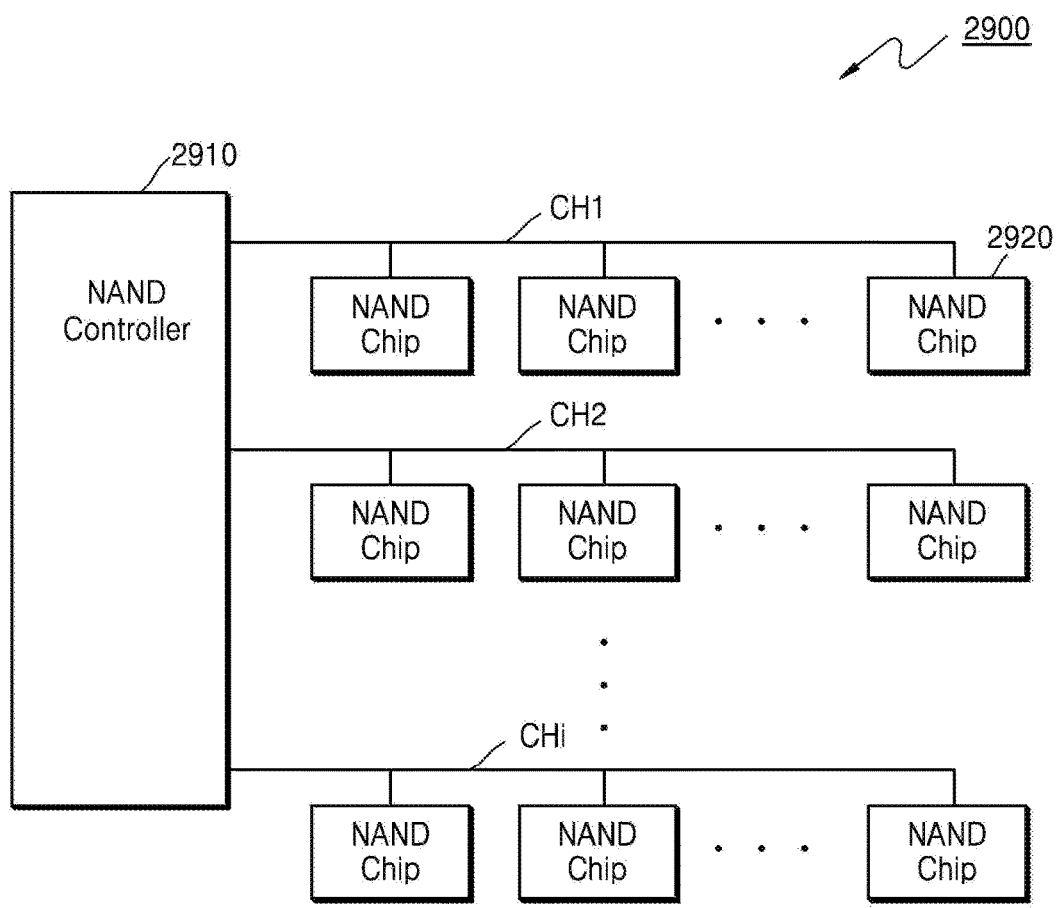
FIG. 29 is a diagram a solid-state device (SSD) according to an example embodiment of the inventive concepts.

FIG. 29 is a diagram a solid-state device (SSD) 2900 according to an example embodiment of the inventive concepts. Referring to FIG. 29, the SSD 2900 according to the present embodiment may include a NAND controller 2910 and a plurality of NAND chips 2920. The NAND controller 2910 may perform the above-described control operation on a plurality of NAND chips 2920 connected to channels CH1, CH2, . . . , and CHi.

Figure 30:
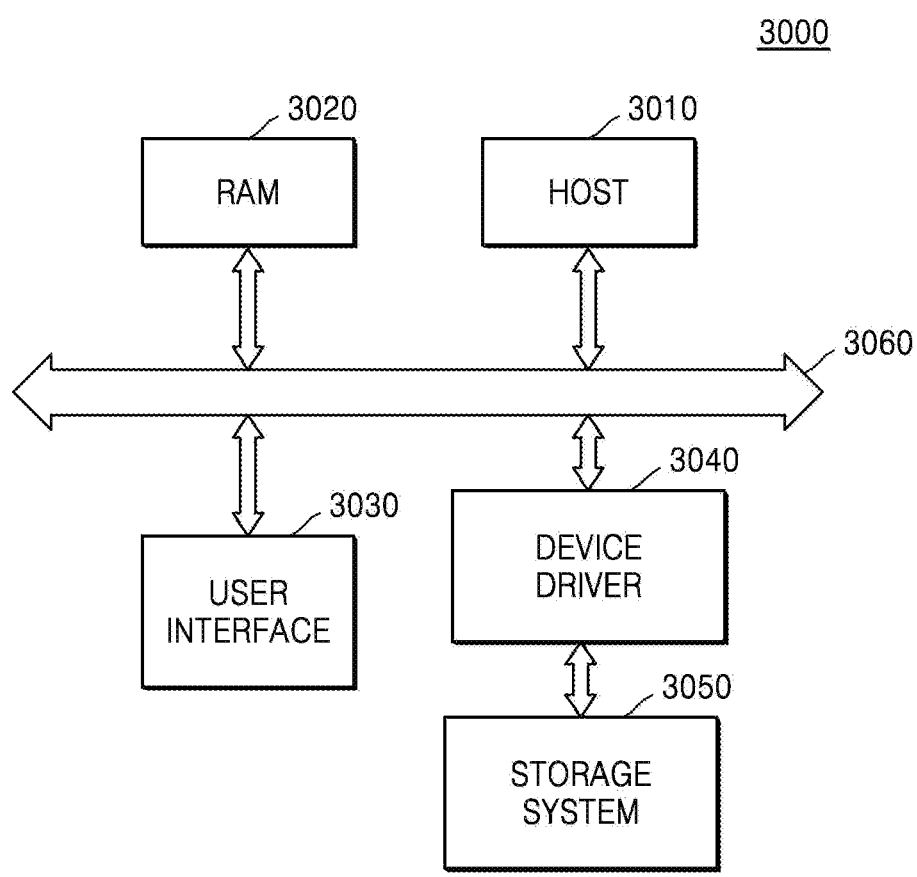
FIG. 30 is a block diagram of a computing system including a non-volatile memory system according to an example embodiment of the inventive concepts.

FIG. 30 is a block diagram of a computing system 3000 including a non-volatile memory system according to an example embodiment of the inventive concepts. The computing system 3000 according to the present embodiment may be a mobile device or a desk-top computer and include a host 3010 including a central processing unit (CPU), a RAM 3020, a user interface 3030, and a device driver 3040, each of which may be electrically connected to a bus 3060. A non-volatile storage system 3050 may be connected to the device driver 3040. The host 3010 may control the entire computing system 3000 and perform operations corresponding to commands input by a user through the user interface 3030. The RAM 3020 may function as a data memory of the host 3010, and the host 3010 may write or read user data to and from the non-volatile storage system 3050 through the device driver 3040. Also, although FIG. 30 illustrates an example in which the device driver 3040 for controlling operations and management of the non-volatile storage system 3050 is provided outside the host 3010, the device driver 3040 may be provided in the host 3010. The computing system 3000 may control the non-volatile storage system 3050 using the above-described control method.

Figure 31:
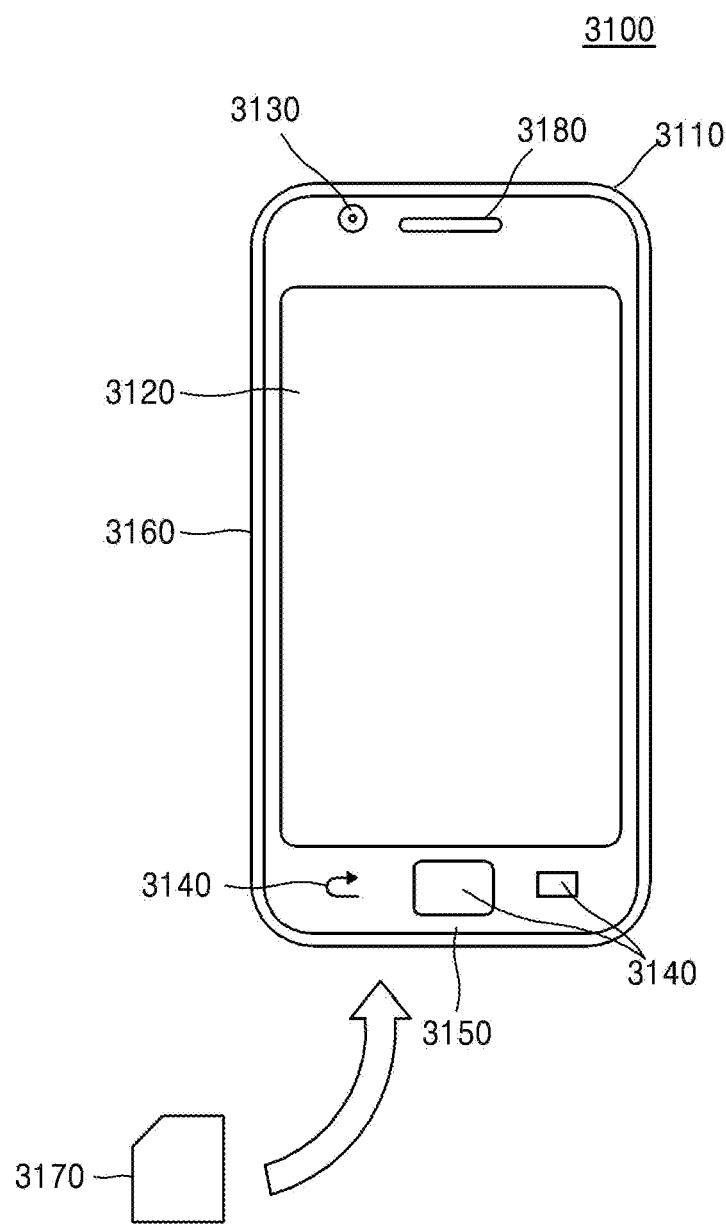
FIG. 31 is a diagram of an example of a mobile terminal including a memory system according to an example embodiment of the inventive concepts.

FIG. 31 is a diagram of an example of a mobile terminal 3100 including a memory system according to an example embodiment of the inventive concepts. A memory system according to an example embodiment of the inventive concepts may be mounted in the mobile terminal 3100 of FIG. 31. The mobile terminal 3100 may not be a smartphone of which functions are not limited but may be mostly changed and expanded using applied programs. The mobile terminal 3100 may include an embedded antenna 3110 configured to exchange radio-frequency (RF) signals with a wireless base station, and a display screen 3120 configured to display images captured by a camera 3130 or images received by the antenna 3110 and decoded. The display screen 3120 may be a liquid crystal display (LCD), an organic light emitting diode (OLED) screen. The mobile terminal 3100 may include an operation panel 3140 including a control button and a touch panel. Also, when the display screen 3120 is a touch screen, the operation panel 3140 may further include a touch sensing panel of the display screen 3120. The mobile terminal 3100 may include a speaker 3180 or other types of sound output units configured to output voice and sound and a microphone 3150 or other types of sound input units to which voice and sound are input. The mobile terminal 3100 may further include a camera 3130 (e.g., a charge-coupled device (CCD) camera) configured to capture video and still images. Also, the mobile terminal 3100 may include a storage medium 3170 configured to store encoded or decoded data along with video or still images captured by the camera 3130, received via E-mail, or obtained in other forms, and a slot 3160 configured to mount the storage medium 3170 in the mobile terminal 3100. The mobile terminal 3100 may control the storage medium 3170 in the above-described control method.

While the inventive concepts has been particularly shown and described with reference to example embodiments thereof, it will be understood that various changes in form and details may be made therein without departing from the spirit and scope of the following claims.

The invention claimed is:

1. A method, comprising:
   setting a first temperature range based upon occurrence of errors for a memory device;
   sensing, by the memory device, a temperature of the memory device to generate temperature information in response to a mode signal indicating a first mode;
   outputting, by the memory device, the temperature information in response to the mode signal not indicating the first mode;
   receiving, by the memory device, a command from a memory controller;
   generating, by the memory device, a response in response to the command, the response including,
      status information and not the temperature information in response to the sensed temperature being within the first temperature range, and
      the status information and temperature information in response to the sensed temperature being outside the first temperature range, the temperature information including a value corresponding to the sensed temperature;
   transmitting, by the memory device, the response to the memory controller; and
   controlling, by the memory controller, at least one memory control characteristic of the memory device based on the temperature information included in the response.

2. The method of claim 1, wherein the status information includes read status information indicating whether a reading status of the memory device is one of busy and ready.

3. The method of claim 1, further comprising:
   the receiving a command includes receiving a read status request command anytime.

4. The method of claim 1, further comprising:
   the receiving a command includes receiving a read status request command regardless of whether the memory device is in a ready status.

5. The method of claim 1, wherein the temperature information is one of a plurality of index values, and each of the plurality of index values is associated with different temperature ranges.

6. The method of claim 1, wherein the sensing is triggered by receiving at least one of a program command, a read command, or an erase command.

7. The method of claim 6, further comprising:
   storing the sensed temperature, and
   wherein the generating includes generating the temperature information in response to the program command.

8. The method of claim 1, wherein the sensing is triggered by receiving the command.

9. The method of claim 1, wherein the temperature information indicates one range of temperatures from a plurality of different ranges.

10. The method of claim 1, wherein the memory control characteristic includes at least one of a number of incremental step pulse program voltages, a level of program pulses, a level of erase voltages, a level of program verify voltages or duration to apply voltages to the memory device.

11. A method, comprising:
   setting, by a memory device, a first temperature range based upon occurrence of errors for the memory device;
   sensing, by the memory device, a temperature of the memory device to generate temperature information in response to a mode signal indicating a first mode;

outputting, by the memory device, the temperature information in response to the mode signal not indicating the first mode;

receiving, by the memory device, a read status request command from a memory controller;

generating, by the memory device, a response in response to the read status request command, the response including, status information and not the temperature information in response to the sensed temperature being within the first temperature range, the status information indicating whether the memory device is in a busy status or a ready status, and the status information and temperature information, in response to the sensed temperature being outside the first temperature range, the temperature information including a value corresponding to the sensed temperature;

transmitting, by the memory device, the response to the memory controller; and controlling, by the memory controller, at least one of memory control characteristic of the memory device based on the temperature information included in the response.

12. The method of claim 11, further comprising:
receiving the read status request command regardless of whether the memory device is in the ready status.

13. The method of claim 11, wherein the temperature information is one of a plurality of index values, and each of the plurality of index values is associated with different temperature ranges.

14. The method of claim 11, wherein the sensing is triggered by receiving the read status request command.

15. The method of claim 11, wherein the sensing is triggered by receiving at least one of a program command, a read command, or an erase command.

16. The method of claim 15, further comprising:
storing the sensed temperature.

17. A method, comprising:
setting a first temperature range based upon occurrence of errors for a memory device;

sensing, by a temperature sensor of the memory device, a temperature of the memory device to generate temperature information in response to a mode signal indicating a first mode;

outputting, by the memory device, the temperature information in response to the mode signal not indicating the first mode;

sending, by a controller, a single command to the memory device regardless of a ready status of the memory device;

receiving, by the controller, a response from the memory device in response to the single command, the response including, status information and not the temperature information in response to the sensed temperature being within the first temperature range, the status information indicating whether the memory device is in a busy status or the ready status, and the status information and temperature information in response to the sensed temperature being outside the first temperature range, the temperature information including a value corresponding to the sensed temperature; and selectively changing, by the controller, at least one memory control characteristic for the memory device based on the temperature information included in the response.

18. The method of claim 17, wherein the single command is a temperature information request command requesting the temperature information.

19. The method of claim 17, wherein
the single command is a read status request command, the read status request command requesting status information on the memory device.

20. The method of claim 17, wherein the memory control characteristic includes at least one of read voltages, incremental step pulse program voltages, erase voltages, program verify voltages, or duration to apply voltages to the memory device.

* * * * *